(12) United States Patent
Inoue et al.

(10) Patent No.: US 6,703,702 B2
(45) Date of Patent: Mar. 9, 2004

(54) IC CHIP MOUNTING STRUCTURE AND DISPLAY DEVICE

(75) Inventors: Hirokazu Inoue, Hitachi (JP); Toyoshi Kawada, Kawasaki (JP); Yuji Sano, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 10/202,831

(22) Filed: Jul. 26, 2002

(65) Prior Publication Data

US 2003/0020152 A1 Jan. 30, 2003

(30) Foreign Application Priority Data

Jul. 30, 2001 (JP) ........................ 2001-230307
Jul. 5, 2002 (JP) ........................ 2002-197621

(51) Int. Cl.[7] ..................... H01L 23/06; H01L 23/24
(52) U.S. Cl. ................. 257/684; 257/687; 257/584; 257/621; 257/729; 257/723; 361/736; 361/748; 361/750; 361/752; 361/790
(58) Field of Search ....................... 257/684, 687, 257/584, 621, 729, 723; 361/736, 748–750, 752, 790

(56) References Cited

U.S. PATENT DOCUMENTS 6,365,978 B1 * 4/2002 Ibnabdeljalil et al. ....... 257/786
6,407,508 B1 6/2002 Kawada et al.
6,410,981 B2 * 6/2002 Tao ........................... 257/704

FOREIGN PATENT DOCUMENTS

| EP | 1 006 505 A2 | 6/2000 |
| EP | 1 065 720 A2 | 1/2001 |
| JP | 5-198603 | 8/1993 |
| JP | 5-226487 * | 9/1993 |
| JP | 10-260641 | 9/1998 |
| JP | 2000-250425 | 9/2000 |
| JP | 2000-268735 | 9/2000 |
| JP | 2000-299416 | 10/2000 |

* cited by examiner

*Primary Examiner*—Jasmine Clark
(74) *Attorney, Agent, or Firm*—Staas & Halsey LLP

(57) ABSTRACT

IC CHIP MOUNTING STRUCTURE has IC chips having protruding electrodes, a flexible printed circuit board having conductors connected to the protruding electrodes of the IC chips, and a protective plate attached to the flexible printed circuit board. The protective plate has openings to accommodate the driver IC chips. A resin member having a high heat conductivity is arranged in the opening in contact with the surface of the IC chip. The IC chip mounting structure can be attached to a chassis of a plasma display device so that heat generated by the driver IC chip is transferred to the chassis via the heat conductive resin member.

15 Claims, 26 Drawing Sheets

IC CHIP MOUNTING STRUCTURE AND DISPLAY DEVICE

BACKGROUND OF THE INVENTION

1. Field of the Invention

The present invention relates to an IC chip mounting structure adapted for a relatively large power consuming IC chip, which can be manufactured in mass production and with a low cost and is of good quality and high reliability, utilizing an IC chip mounting structure, typically, a flat panel display device.

2. Description of the Related Art

Among flat panel display devices, a plasma display device is suitable for reducing the thickness, enlarging the display size, and obtaining a high definition display. Therefore, a plasma display device is exemplary explained below. An AC-type plasma display device (PDP) comprises a plasma display panel including two glass substrates arranged in an opposed relation to each other, and a circuit part for driving and controlling the panel. One of the glass substrates has a plurality of parallel address electrodes, and the other glass substrate has a plurality of mutually parallel sustain electrodes extending perpendicular to the address electrodes.

Circuit boards having drive circuits are provided for applying a drive voltage to the electrodes on the glass substrates. A chassis is attached to one of the substrates, and the circuit boards are arranged on the chassis. Wiring boards (flexible printed circuit boards) are used to connect the electrodes of the glass substrates to the drive circuits. The driver IC chips are mounted on the wiring boards. In this way, a large-sized, thin plasma display device can be configured.

In the prior art, the electrodes of the driver IC chip mounted on the wiring board are connected to the wiring (conductors) of the wiring board by a wire bonding. The method using the wire bonding, however, has a low productivity as compared with the method using a flip-chip structure. For this reason, a method is desirably employed in which the electrodes of the driver IC chip are connected to the conductors of the wiring board using the flip-chip structure higher in productivity.

Also, with the plasma display device, a high drive voltage is applied to the electrodes of the glass substrates. As a result, a high voltage and a large current are supplied to the driver IC chips mounted on the wiring board so that the driver IC chips themselves generate heat. In employing a structure for connecting the electrodes of the driver IC chip to the conductors of the wiring board using the flip-chip structure, therefore, the heat radiation of the driver IC chip must be taken into consideration.

Japanese Unexamined Patent Publication No. 10-260641 discloses a configuration in which the chassis of the plasma display panel is extended longer than the normal one, and a driver IC chip is arranged on the extension. This configuration poses the problem, however, that the size of the plasma display device is further increased. Also, in the invention disclosed by this publication, one side of the driver IC chip is mounted on the flexible printed wiring board, and the other exposed side of the driver IC chip is fixed on the chassis by an adhesive tape having a superior heat conductivity. Therefore, the problem is that the driver IC chip left exposed is easily damaged if contacted by a hand or a tool.

Japanese Unexamined Patent Publication No. 2000-268735 discloses a configuration in which one of the glass substrates is extended and a driver IC chip is arranged on the extension. Also in this case, the problem is encountered that the size of the plasma display device is further increased. Also, as in the preceding case, the driver IC chip is left exposed, and therefore the problem is posed that the driver IC chip is easily damaged if contacted by a hand or a tool.

Japanese Unexamined Patent Publication No. 2000-299416 discloses a configuration in which the side of the IC chip having bump electrodes is connected face down to a flexible printed circuit board, and the other side of the IC chip is fixed to a radiation member by an adhesive. According to this publication, the IC chip is fixed to the radiation member by the adhesive, and therefore the radiation member functions as a leverage so that stress is generated in the connector between the IC chip and the flexible printed circuit board. Also, in this publication, resin is filled between the flexible printed circuit board and the radiation member to protect the IC chip. Before being fixed to the radiation member, the IC chip is handled with the flexible printed circuit board while being exposed, thereby posing the problem that it is easily damaged when the driver IC chip is contacted by a hand or a tool.

SUMMARY OF THE INVENTION

The object of the present invention is to solve the above described problems, and to provide an IC chip mounting structure adapted for a relatively large power consuming IC chip, which can be manufactured in mass production and with a low cost and is of good quality and high reliability, utilizing an IC chip mounting structure, typically, a flat panel display device.

An IC chip mounting structure, according to the present invention, comprises at least one IC chip having a first surface having electrodes formed thereon and a second surface opposite to the first surface, a wiring board having the IC chip mounted thereon and conductors connected to the electrode of the IC chip, a protective member attached to the wiring board and having an opening comprising a peripheral wall surrounding the IC chip, and a heat conductive first member arranged in the opening of the protective member in contact with the second surface of the IC chip.

A display device, according to the present invention, comprises a flat display panel comprising a pair of substrates having a plurality of electrodes, a circuit board having a circuit for supplying a drive voltage to the electrodes on one of the substrates, a chassis attached to the same substrate and having the circuit board arranged thereon, and a driver IC module mounted on the chassis for connecting the electrodes of the one of the substrates to the circuit of the circuit board. The driver IC module comprises at least one driver IC chip having a first surface having electrodes formed thereon and a second surface opposite to the first surface, a wiring board having the driver IC chip mounted thereon and conductors connected to the electrode of the driver IC chip, a protective member attached to the wiring board and including an opening comprising a peripheral wall surrounding driver IC chip, and a highly heat conductive member arranged in the opening of the protective member in contact with the second surface of the driver IC chip.

With this configuration, the driver IC chip is mounted in a flip chip structure on the wiring board. The protective member is attached to the wiring board, and the driver IC chip is surrounded by the periphery of the opening of the protective member. The height of the surrounding wall of the opening of the protective member is greater than the thickness of the driver IC chip. Even in the case where the driver IC chip is handled in the state mounted on the wiring board, therefore, the driver IC chip is not damaged by a finger or a tool. When the wiring board with the driver IC chip is mounted on the chassis, the heat conductive first member arranged on the opening of the protective member is interposed between the driver IC chip and the chassis, so that the heat generated by the driver IC chip is transmitted to the chassis through the heat conductive first member thereby to radiate the heat of the driver IC chip. On the other hand, the heat conductive first member acts as a cushion for mounting the driver IC chip on the chassis.

In addition, according to further aspects of the present invention, an IC chip mounting structure and a display device in which a driver IC chip and a wiring board having an IC chip mounted thereon can be protected.

BRIEF DESCRIPTION OF THE DRAWINGS

The present invention will become more apparent from the following description of the preferred embodiments, with reference to the accompanying drawing, in which:

FIGS. 16A to 16D are views showing examples of the driver IC module of the plasma display device according to a fourth embodiment of the present invention, wherein FIGS. 16A and 16C are plan views and FIGS. 16B and 16D are sectional views;

FIGS. 17A to 17D are views showing variations of the driver IC module shown in FIGS. 16A and 16B, wherein FIGS. 17A and 17C are plan views and FIGS. 17B and 17D are sectional views;

FIGS. 18A and 18B are views showing a variation of the driver IC module shown in FIGS. 16A and 16B, wherein FIG. 18A is a plan view and FIG. 18B is a sectional view;

FIGS. 19A and 19B are views showing the driver IC module of the plasma display device according to a fifth embodiment of the present invention, wherein FIG. 19A is a plan view and FIG. 19B is a sectional view;

FIGS. 20A and 20B are views showing a variation of the driver IC module shown in FIGS. 19A and 19B, wherein FIG. 20A is a plan view and FIG. 20B is a sectional view;

FIGS. 21A and 21B are views showing a variation of the driver IC module shown in FIGS. 19A and 19B, wherein FIG. 21A is a plan view and FIG. 21B is a sectional view;

FIGS. 22A and 22B are views showing a variation of the driver IC module shown in FIGS. 19A and 19B, wherein FIG. 22A is a plan view and FIG. 22B is a sectional view;

DESCRIPTION OF THE PREFERRED EMBODIMENTS

Figure 1:
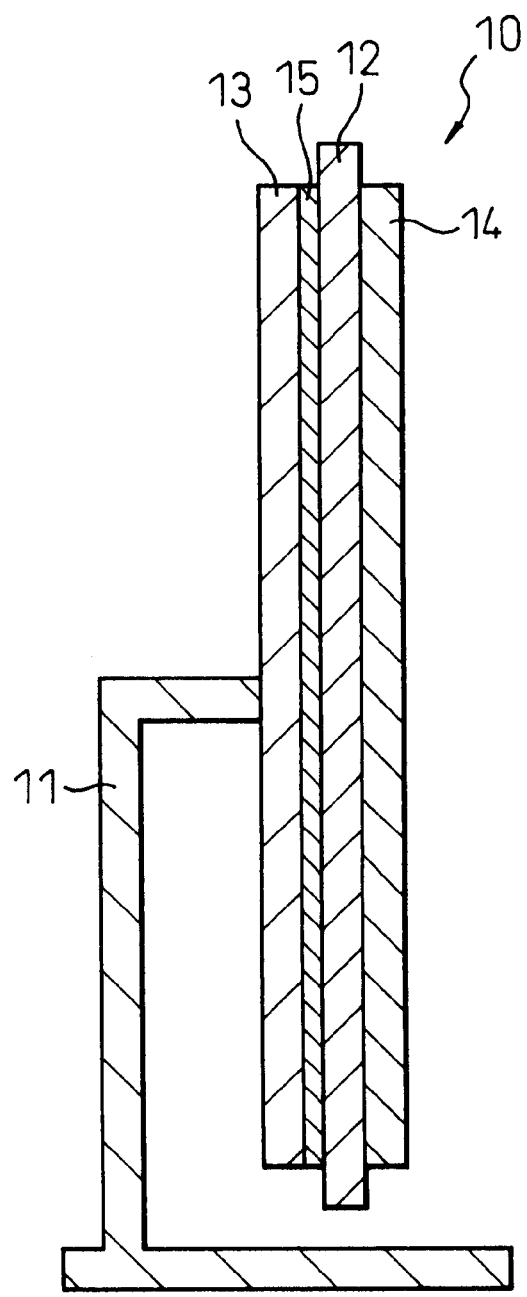
FIG. 1 is a sectional view schematically showing a plasma display device as an example of a display device to which the present invention is applied.
Figure 2:
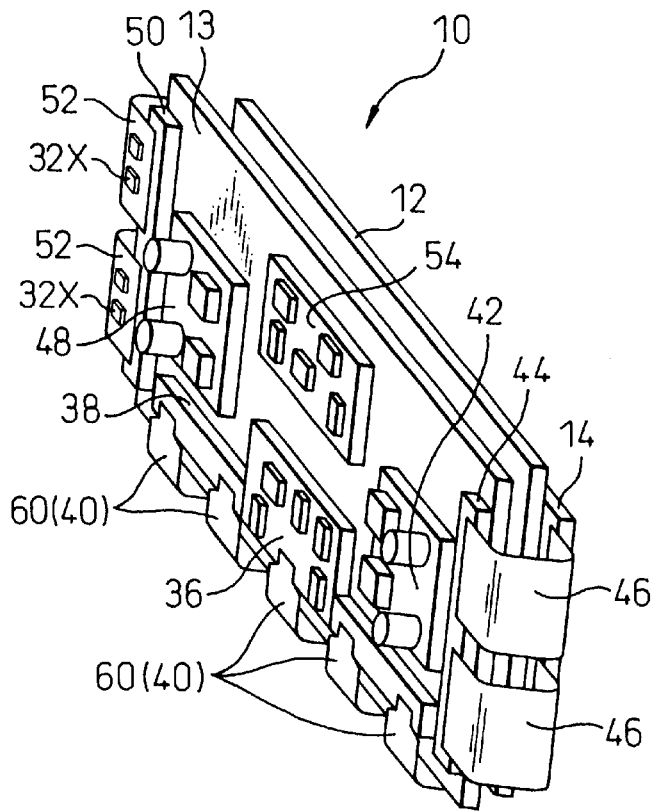
FIG. 2 is a perspective view showing the plasma display device of FIG. 1.

Preferred embodiments of the present invention will now be explained with reference to the drawings. FIG. 1 is a sectional view schematically showing a plasma display device as an example of a display device of the present invention. FIG. 2 is a perspective view showing the plasma display device of FIG. 1 with a support unit removed.

In FIGS. 1 and 2, the plasma display device 10 comprises a support unit (stand) 11, a pair of opposed glass substrates 12 and 14, and a chassis 13 attached to one of the glass substrates by a two-side adhesive sheet 15. The pair of the opposed glass substrates 12 and 14 make up a plasma display panel.

Figure 3:
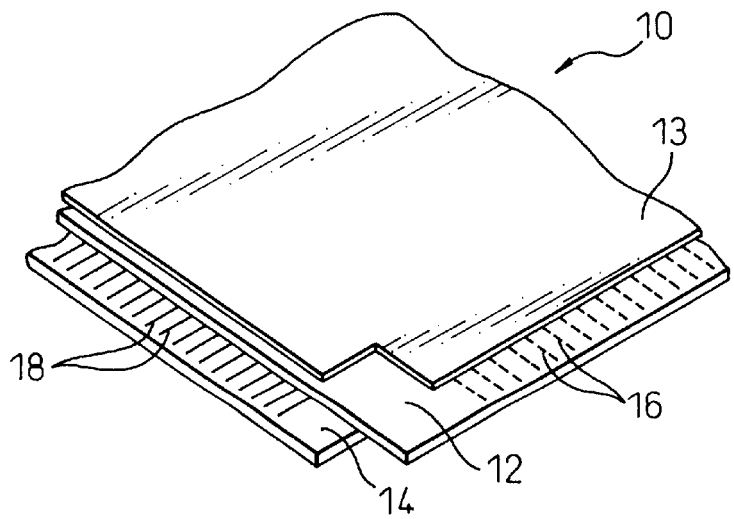
FIG. 3 is a perspective view showing the first and second substrates having electrodes and the chassis.
Figure 4:
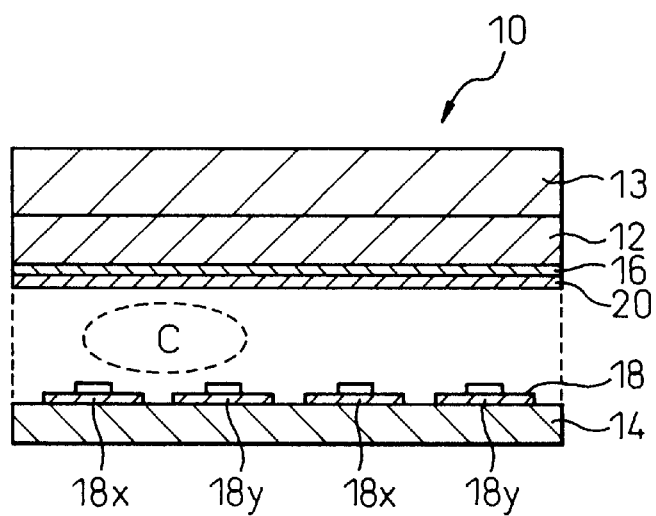
FIG. 4 is a sectional view schematically showing a part of the plasma display device.
Figure 5:
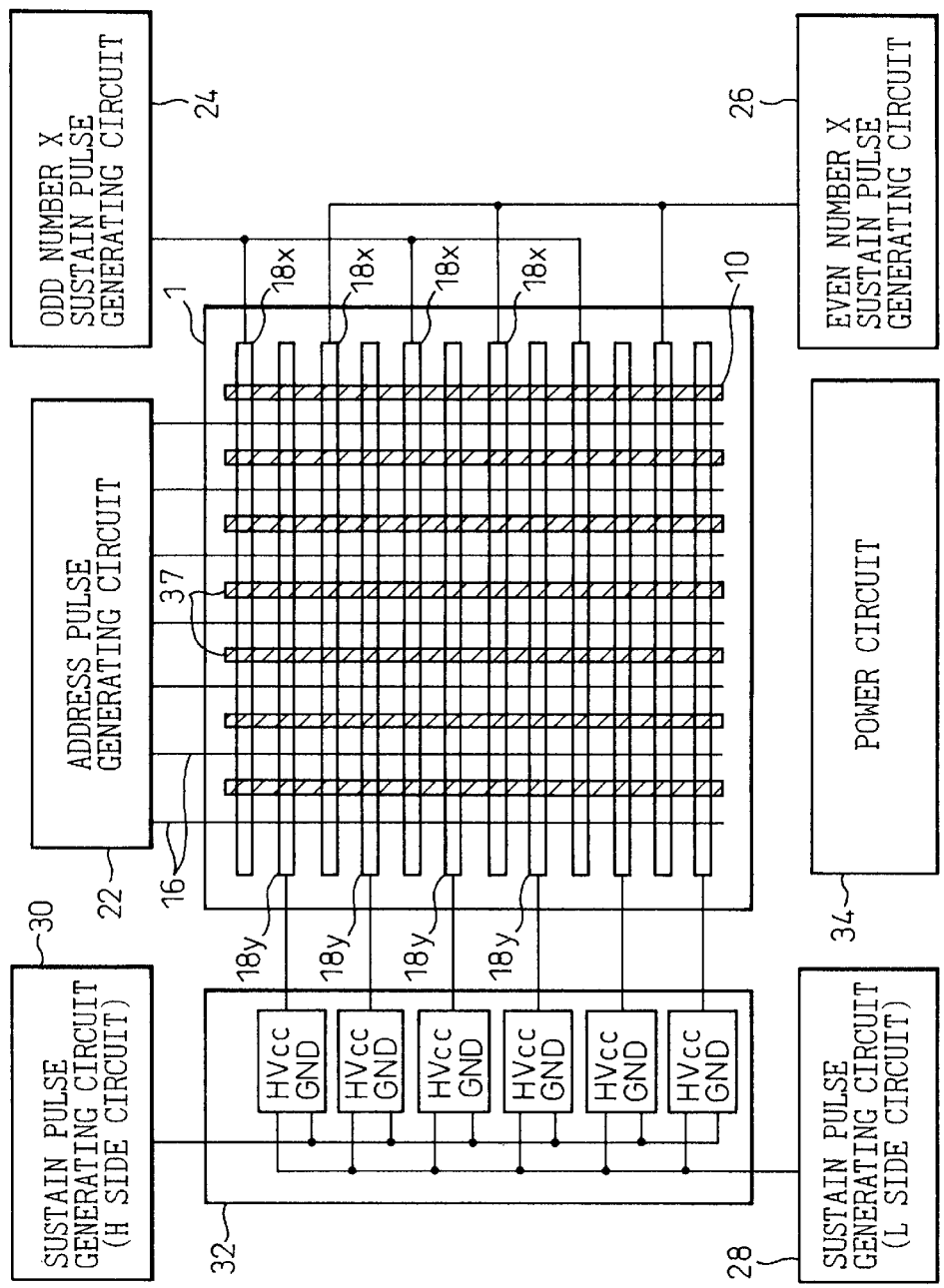
FIG. 5 is a view showing the electrodes and the drive circuits of the plasma display device.

FIG. 3 is a perspective view schematically showing the first and second glass substrates 12 and 14 having electrodes 16 and 18, respectively, and the chassis 13. FIG. 4 is a sectional view showing a part of the plasma display device. FIG. 5 is a view showing electrodes and drive circuits of the plasma display device. In FIGS. 3 to 5, the glass substrate 12 has a plurality of mutually parallel address electrodes 16, and the glass substrate 14 has a plurality of mutually parallel sustain electrodes 18 extending perpendicular to the address electrodes 16. The electrodes 16 and 18 are arranged at right angles to each other. An annular wall (not shown) is arranged on the outer peripheral portion of the first and second glass substrates 12 and 14 between the first and second glass substrates 12 and 14. Partitioning walls 37 are formed between two adjacent ones of the address electrodes 16 in parallel to the address electrodes 16. The partitioning walls 37 and the annular wall fix the first and second glass substrates 12 and 14 to each other.

As shown in FIG. 5, the sustain electrodes 18 include X electrodes 18x and Y electrodes 18y arranged alternately with each other. Specifically, the sustain electrodes 18 include, top down, a first X electrode 18x, a first Y electrode 18y, a second X electrode 18x, a second Y electrode 18y, a third X electrode 18x, a third Y electrode 18y, a fourth X electrode 18x, a fourth Y electrode 18y, and so on.

Drive circuits for supplying a drive voltage to the address electrodes 16 and the sustain electrodes 18 are arranged on the chassis 13. The drive circuits include an address pulse generating circuit 22, X electrode sustain pulse generating circuits 24 and 26, Y electrode sustain pulse generating circuits 28 and 30 and a scanning circuit 32. These circuits are connected to a power circuit 34. The address pulse generating circuit 22 supplies a drive pulse to the address electrodes 16. The odd-number X electrode sustain pulse generating circuit 24 supplies a drive pulse to odd-number X electrodes 18x, and the even-number X electrode sustain pulse generating circuit 26 supplies a drive pulse to the even-number x electrodes 18x. The Y electrode sustain pulse generating circuits 28 and 30 supply a drive pulse to the Y electrodes 18y through the scanning circuit 32.

In FIG. 4, the glass substrate 14 is arranged on the displaying side of the plasma display device 10. The display cells are formed between adjacent ones of the X electrodes 18x and the Y electrodes 18y. In each display cell, a high write voltage pulse is applied between the address electrode 16 and the Y electrode 18y and a seed pulse (priming pulse) is generated by discharge. Then, the sustain pulse is applied between the X electrode 18x and the Y electrode 18y thereby to sustain the discharge and emit light from the display cell. In FIG. 4, character C shows the discharge occurring between the X electrode 18x and the Y electrode 18y.

FIG. 2 shows the circuit boards having the drive circuits of FIG. 5. A circuit board 36 has an address pulse generating circuit 22, and is connected to the address electrodes 16 through an address bus substrate 38 and flexible printed circuit boards (wiring boards) 40. The flexible printed circuit board 40 make up an address driver IC module 60 together with driver IC chips 58 described later. A circuit board 42 includes X electrode sustain pulse generating circuits 24 and 26, and is connected to the X electrodes 18x through a sustain bus substrate 44 and flexible printed circuit boards 46. A circuit board 48 has Y electrode sustain pulse generating circuits 28 and 30, and is connected to the Y electrodes 18y through a sustain bus substrate 50 and flexible printed circuit boards 52. Driver IC chips 32X making up the scanning circuit 32 are mounted on corresponding flexible printed circuit boards 52 and make up a scanning driver IC module. A circuit board 54 has the power circuit 34.

Figure 6:
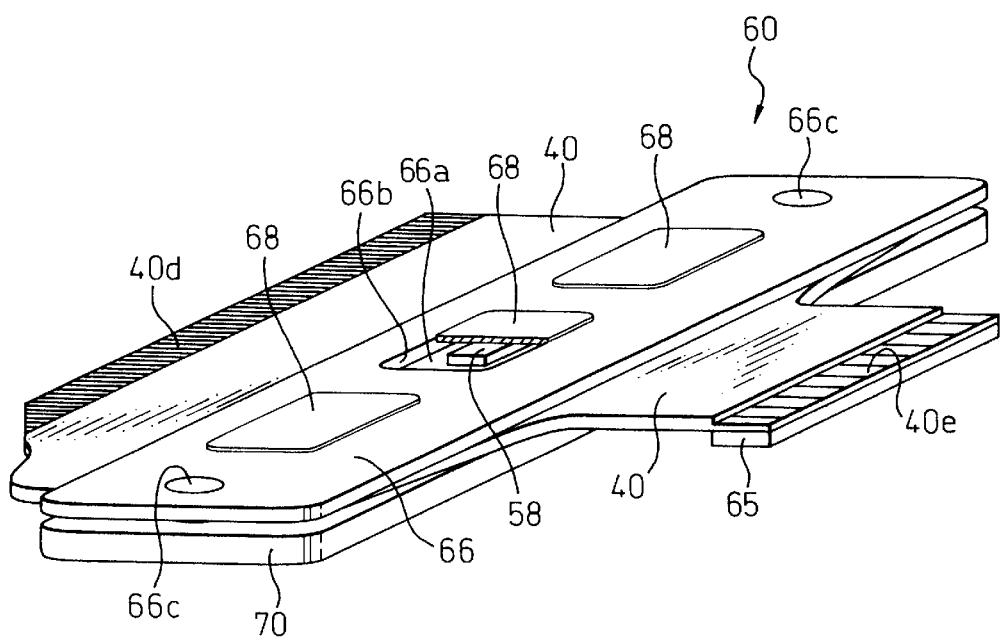
FIG. 6 is a perspective view showing the driver IC module according to the first embodiment of the present invention.
Figure 7:
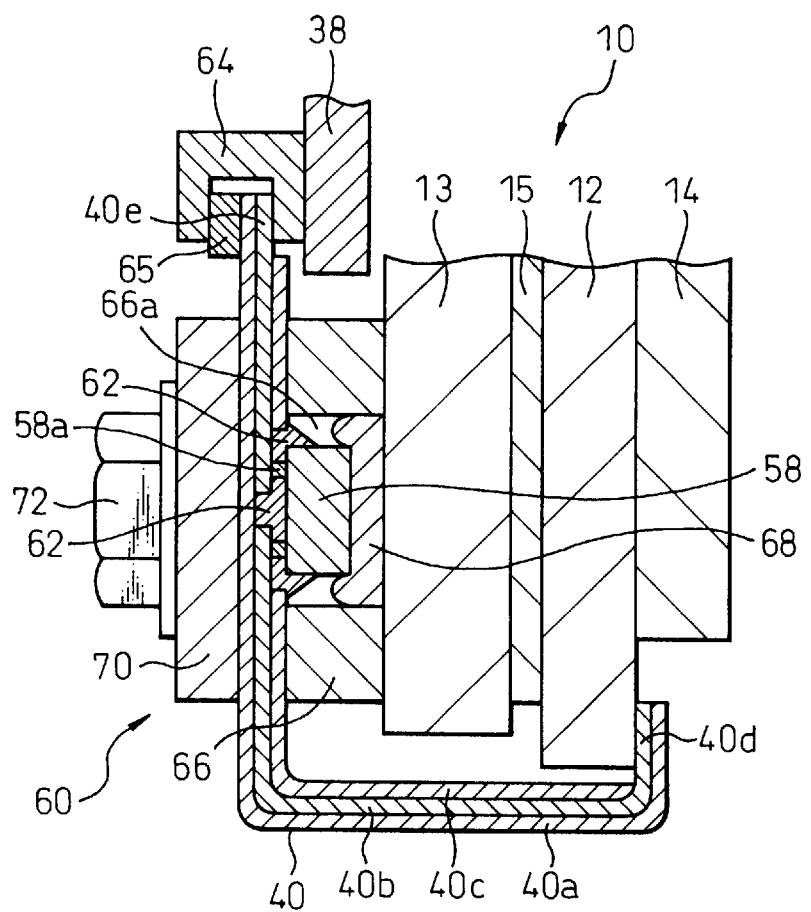
FIG. 7 is a sectional view showing in detail a part of the plasma display device including the driver IC module of FIG. 6.

FIG. 6 is a view showing the driver IC module 60 arranged between the address bus substrate 38 of FIG. 2 and the address electrodes 16, according to the first embodiment of the present invention. FIG. 7 is a sectional view showing in detail a part of the plasma display device 10 including the driver IC module 60 of FIG. 6. In FIGS. 6 and 7, the driver IC module 60 includes a flexible printed circuit board 40, a plurality of driver IC chips 58, a protective plate 66 and highly heat conductive resin sheets 68. Further, this embodiment includes a back plate 70.

The driver IC chip 58 performs the on/off switching operation for supplying a high voltage to the address electrodes 16 under the control of the address pulse generating circuit 22. The driver IC chip 58 outputs pulses with a high voltage and a large current, and therefore the driver IC chip 58 generates heat. Thus, it is necessary to provide a heat radiation structure for radiating the heat generated by the driver IC chip 58.

Figure 8A:
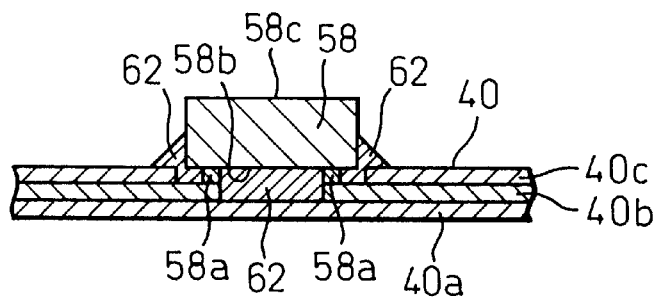
FIGS. 8A to 8C are views showing the steps of assembling the driver IC module of FIGS. 6 and 7.
Figure 8B:
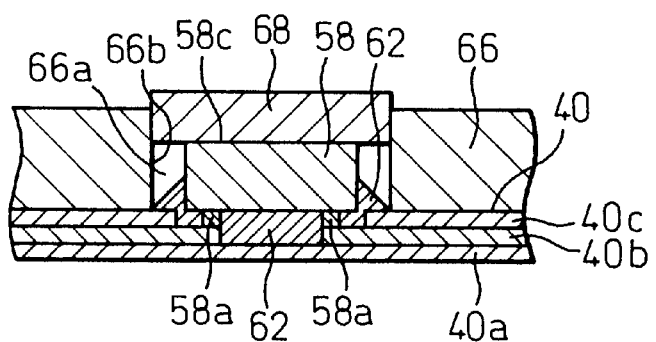
Figure 8C:
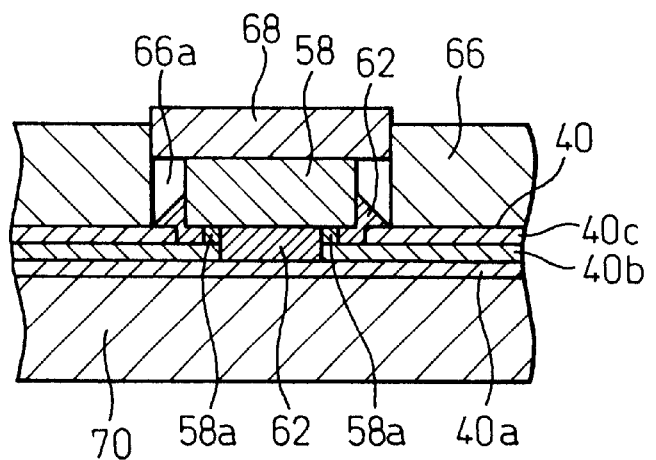

FIGS. 8A to 8C are views showing the steps of assembling the driver IC module 60 for the display device. FIG. 8A is a view showing the step of mounting the driver IC chip 58 on the flexible printed circuit board 40 in a flip chip structure. The driver IC chip 58 includes a first surface 58b having a circuit and protruding electrodes 58a formed thereon at the output terminals of the circuit and a second surface 58c opposite to the first surface 58b onto which a circuit is provided. The protruding electrode 58a comprises a bump having the height of about 10 μm, which is formed by plating gold on the connecting pad (output terminal) of the driver IC chip 58.

The flexible printed circuit board 40 includes a substrate 40a of resin such as polyimide, copper wiring (conductors) 40b formed on the substrate 40a and a cover film 40c covering the wiring 40b. The surface of the copper wiring 40b is plated with tin. When driver IC chip 58 is mounted on the flexible printed circuit board 40, a part of the cover film 40c removed, and the protruding electrodes 58a of the driver IC chip 58 are bonded to the exposed wiring 40b of the flexible printed circuit board 40 by the flip chip method. The resin substrate 40a is not removed or cut. The protruding electrodes 58a and the wiring 40b kept in contact with each other are heated to a temperature higher than 300° C., and a gold-tin alloy is formed and the protruding electrodes 58a and the wiring 40b are bonded to each other. This connection structure, though having a superior electrical connection, has a low mechanical strength. Thus, a resin 62 is filled over the flexible printed circuit board 40 and around the driver IC chip 58 in such a manner as to cover the electrical connection, thereby assuring the mechanical reinforcement and the protection against water.

Further, as shown in FIG. 6, the flexible printed circuit board 40 has at one end thereof a first connection terminal portion 40d for connection to the address electrodes 16, and at the other end thereof a second connection terminal portion 40*e* for connection to the address bus substrate 38. As shown in FIG. 7, the first connection terminal portion 40*d* is connected to the address electrodes 16, and the second connection terminal portion 40*e* is connected to the address bus substrate 38 by a connector 64. Numeral 65 designates a terminal reinforcing plate for the second connection terminal portion 40*e*. The driver IC chip 58 is mounted on the flexible printed circuit board 40 at the intermediate portion between the first connection terminal portion 40*d* and the second connection terminal portion 40*e* and is arranged at a position facing the chassis 13.

As shown in FIGS. 6 and 7, the protective plate 66 is formed of a resin material such as epoxy resin or a metal such as aluminum, and mounted, on the side of the flexible printed circuit board 40 where the driver IC chip 58 is mounted, by an adhesive. The protective plate 66 has openings 66*a*. The opening 66*a* is defined by the peripheral wall 66*b*. When the protective plate 66 is mounted on the flexible printed circuit board 40, the driver IC chips 58 enter the openings 66*a* and are surrounded by the peripheral walls 66, respectively. Also, the protective plate 66 has screw insertion holes 66*c*.

A high heat conductive resin sheet 68 is arranged in the corresponding opening 66*a* of the protective plate 66 in contact with the second surface 58*c* of the driver IC chip 58. In FIG. 6, one resin sheet 68 is shown in a partially cutaway form so that the opening 66*a* and the driver IC chip 58 under the resin sheet 68 are visible. After mounting the resin sheet 68, the driver IC chip 58 is covered by the resin sheet 68. The resin sheet 68 is made of a mixture of a resin material and a material such as a ceramic having a high heat conductivity.

FIG. 8B shows that the protective plate 66 is attached to the flexible printed circuit board 40 and the resin sheet 68 is arranged in the opening 66*a* of the protective plate 66. In this embodiment, the opening 66*a* of the protective plate 66 and the resin sheet 68 are rectangular in shape, and the resin sheet 68 is held by the protective plate 66 by friction with the surrounding wall 66*b* of the opening 66*a* of the protective plate 66. Alternatively, the resin sheet 68 may be fixed to the driver IC chip by an adhesive.

The thickness of the protective plate 66 is greater than the height of the driver IC chip 58 mounted on the flexible printed circuit board 40, and less than the height of the resin sheet 68 in contact with the driver IC chip 58 mounted on the flexible printed circuit board 40. The thickness of the protective plate 66, for example, is a value equal to the distance from the surface of the flexible printed circuit board 40 to the second surface 58*c* of the driver IC chip 58, plus 0.2 mm. On the other hand, the thickness of the resin sheet 68 is about 0.4 mm. Thus, one part of the resin sheet 68 is inserted in the opening 66*a* of the protective plate 66, while the other part of the resin sheet 68 protrudes out of the surface of the protective plate 66. When the resin sheet 68 is arranged in the opening 66*a* of the protective plate 66, a space is formed between the surrounding wall 66*b* and the driver IC chip 58 in the opening 66*a*.

The back plate 70 is made of a metal, such as aluminum, is 2 mm thick, and is mounted by an adhesive on the flexible printed circuit board 40 on the side thereof far from the side having the driver IC chip 58 mounted thereon. This state is shown in FIG. 8C. In this way, the drive IC module 60 is formed by the flexible printed circuit board 40, a plurality of the driver IC chips 58, the protective plate 66, the resin sheet 68 and the back plate 70, which are integrated one another.

The color plasma display device 10 includes about 3000 address electrodes 16, and each drive IC chip 58 controls 128 address electrodes 16. Thus, 24 driver IC chips 58 are arranged in line along one side of the glass substrate 12. The driver IC module 60 shown in FIG. 6 includes three driver IC chips 58. Each driver IC module 60 can include three or more driver IC chips 58.

The back plate 70 and the flexible printed circuit board 40 have screw insertion holes in alignment with the screw insertion holes 66*c* of the protective plate 66. When mounting the driver IC module 60 on the chassis 13, the first connection terminal portion 40*d* of the flexible printed circuit board 40 is connected to the address electrodes 16, the second connection terminal portion 40*e* is connected to the address bus substrate 38, and the screws 72 are inserted in the screw insertion holes 66*c*, through corresponding screw insertion holes in alignment therewith, screwed to the threaded holes (not shown) formed in the chassis 13 (FIG. 7).

The back plate 70 is pressed by the screws 72, so that the driver IC module 60 is fixed to the chassis 13. The back plate 70 is at the same potential as the chassis 13 through the screws 72. The chassis 13 assumes the ground potential, and therefore the back plate 70 also assumes the ground potential. As a result, the electromagnetic noise generated by the driver IC chip 58 is prevented from leaking outside. Also, since the chassis 13 and the protective plate 66 form a container structure, the electromagnetic noise generated by the driver IC chip 58 is prevented from leaking outside. Thus, this embodiment also has the effect of preventing the electromagnetic noise. In the case where the prevention of the electromagnetic noise is not required, however, the back plate 70 may be formed of a material other than metal such as an insulating resin material.

When the driver IC chip 58 is pressed against the chassis 13, the second surface 58*c* of the driver IC chip 58 is pressed against the chassis 13 through the resin sheet 68. Generally, the second surface 58*c* of the driver IC chip 58 is not smooth and the surface of the chassis 13 is not smooth. In the case where the second surface 58*c* of the driver IC chip 58 comes into direct contact with the chassis 13, a small gap is formed between them, and satisfactory heat transmission is not achieved. In the case where the resin sheet 68 is arranged between the second surface 58*c* of the driver IC chip 58 and the chassis 13, when the driver IC chip 58 is pressed toward the chassis 13, the resin sheet 68 is deformed and, at the same time, fills the small gap between the second surface 58*c* of the driver IC chip 58 and the chassis 13, so that the second surface 58*c* of the driver IC chip 58 comes into thermally close contact with the chassis 13. In this way, a heat transmission path is formed from the second surface 58*c* of the driver IC chip 58 to the chassis 13 through the resin sheet 68, so that the heat generated by the the driver IC chip 58 can be effectively conducted to the chassis 13. For example, the heat conductivity of the resin sheet 68 is 4 W/mk, and the gap between the driver IC chip 58*a* and the chassis 13 is about 0.2 mm, so the resin sheet 68 has a sufficiently small heat resistance.

In this way, the resin sheet 68 having a high heat conductivity can efficiently release the heat generated by the driver IC chip 58 to the chassis 13. The chassis 13 has a sufficiently large area and acts as a heat sink. The resin sheet 68 is accommodated in the opening 66*a* and therefore can be easily handled. Further, since each driver IC chip 58 is covered with the resin sheet 68, the second surface 58*c* of the driver IC chip 58 is not exposed, so a finger or a tool cannot directly contact the driver IC chip 58.

Especially, the semiconductor material (silicon, for example) making up the driver IC chip 58 is easily cracked or broken. As shown in FIG. 8A, therefore, if the driver IC chip 58 is handled with the second surface 58c of the driver IC chip 58 exposed, the exposed second surface 58c (especially the corner portion) is liable to be damaged by a finger or a tool. In this invention, the second surface 58c of the driver IC chip 58 is at a position lower than the protective plate 66. Even in the absence of the resin sheet 68, therefore, there is less chance of a finger or a tool unexpectedly contacting the second surface 58c (especially, the corner portion) of the driver IC chip 58. Thus, the protective plate 66 has the function of protecting the driver IC chip 58. Further, in the case where the driver IC module 69 with the resin sheets 68 is handled or transported, the driver IC chip 58 is covered by the resin sheet 68 and is rarely damaged. Also, the driver IC module 60 having a plurality of the driver IC chips 58 incorporated therein can be handled both easily and conveniently.

Also, as shown in FIG. 7, after the resin sheet 68 is deformed to some degree, the surface of the protective plate 66 comes into contact with the surface of the chassis 13. As a result, the stress is relaxed which otherwise might be exerted on the portions of the resin sheet 68 corresponding to the corner portions of the driver IC chip 58 since the resin sheet 68 is not excessively compressed. In the process, part of the resin sheet 68 is deformed and enters the internal space of the opening 66a of the protective plate 66.

In the absence of the back plate 70, the flexible printed circuit board 40 is not easily pressed toward the chassis 13, due to the flexibility thereof. The pressure thus needed is provided by the back plate 70. Also, the back plate 70 has an electromagnetic shield effect, and therefore the noise generated in the driver IC chip 58 is effectively shielded. The back plate 70 can be configured of a material other than metal.

Figure 9:
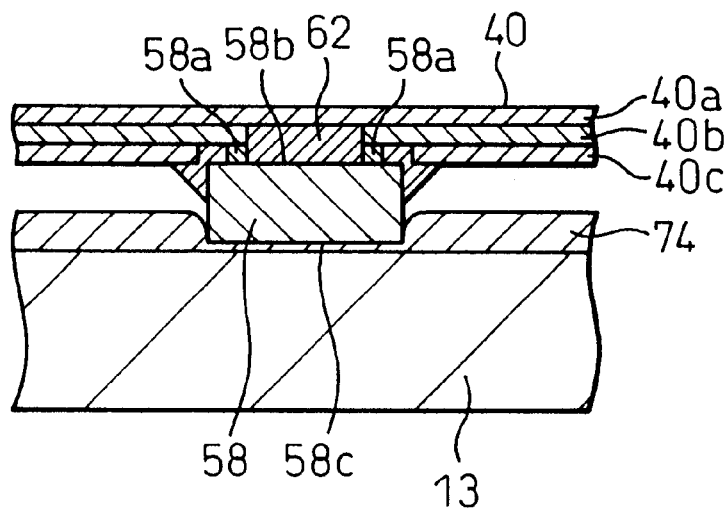
FIG. 9 is a view showing a comparative example of the driver IC module of the display device.
Figure 10:
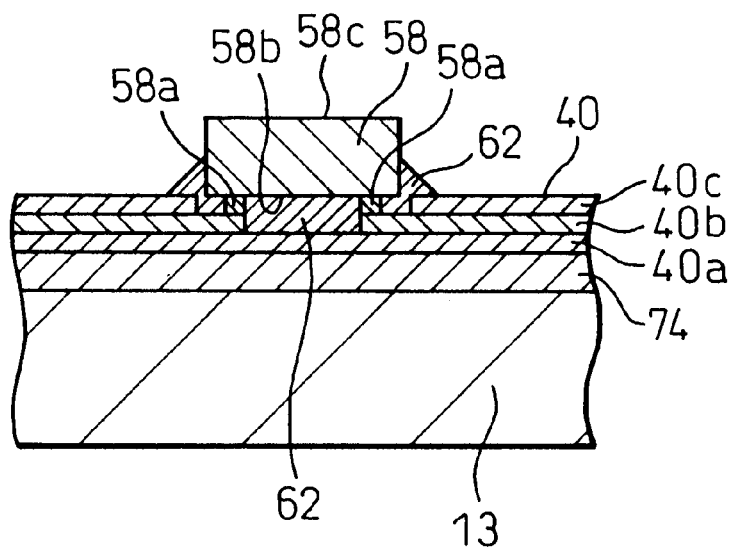
FIG. 10 is a view showing a comparative example of the driver IC module of the display device.

FIGS. 9 and 10 are views showing comparative examples of the driver IC module for the display device. FIG. 9 shows the case where the protective plate 66 and the resin sheet 68 are not provided. As in FIG. 8A, the driver IC chip 58 is mounted on the flexible printed circuit board 40 by the flip chip bonding method, and the protruding electrodes 58a on the first surface 58b are connected to the wiring 40b of the flexible printed circuit board 40 with the second surface 58c of the driver IC chip 58 directed outward. In the absence of the protective plate 66 as in this invention, a resin sheet 74 having a large area is bonded to the chassis 13, and the second surface 58c of the driver IC chip 58 is bonded to the resin sheet 74. By doing so, the heat generated by the driver IC chip 58 can be transmitted to the chassis 13 and radiated through the resin sheet 74. However, if the heat conductivity of the resin sheet 74 having a high heat conductivity is secured, the adhesive power of the resin sheet 74 is reduced. As a result, the driver IC chip 58 is required to be pressed against the chassis 13 with such a force as to deform the resin sheet 74 considerably. A large deformation of the resin sheet 74 would apply the stress to the corner portions of the second surface 58c of the driver IC chip 58, thereby easily damaging the driver IC chip 58. Also, the driver IC chip 58 must be handled with the second surface 58c exposed.

Also in FIG. 10, the driver IC chip 58 is mounted on the flexible printed circuit board 40 by the flip chip bonding method. A resin sheet 74 having a large area is bonded to the chassis 13. In FIG. 10, the flexible printed circuit board 40 is attached to the chassis 13, and the second surface 58c of the driver IC chip 58 is exposed outside. In this case, the substrate 40a of the flexible printed circuit board 40 has a low heat conductivity and, therefore, the heat generated by the driver IC chip 58 is not efficiently transmitted to the chassis 13. Further, in the configuration of FIG. 10, a heat sink having fins may be provided on the second surface 58c of the driver IC chip 58. Once such a heat sink is mounted, however, the whole thickness of the plasma display device 10 is undesirably increased.

Figure 11:
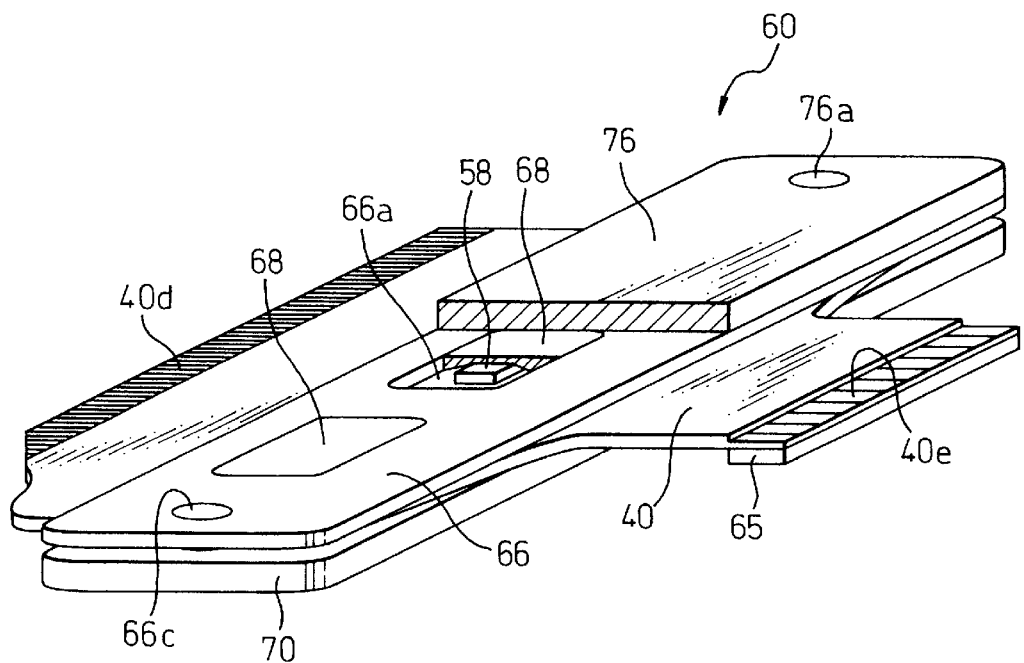
FIG. 11 is a perspective view showing the driver IC module of the plasma display device according to a second embodiment of the present invention.
Figure 12:
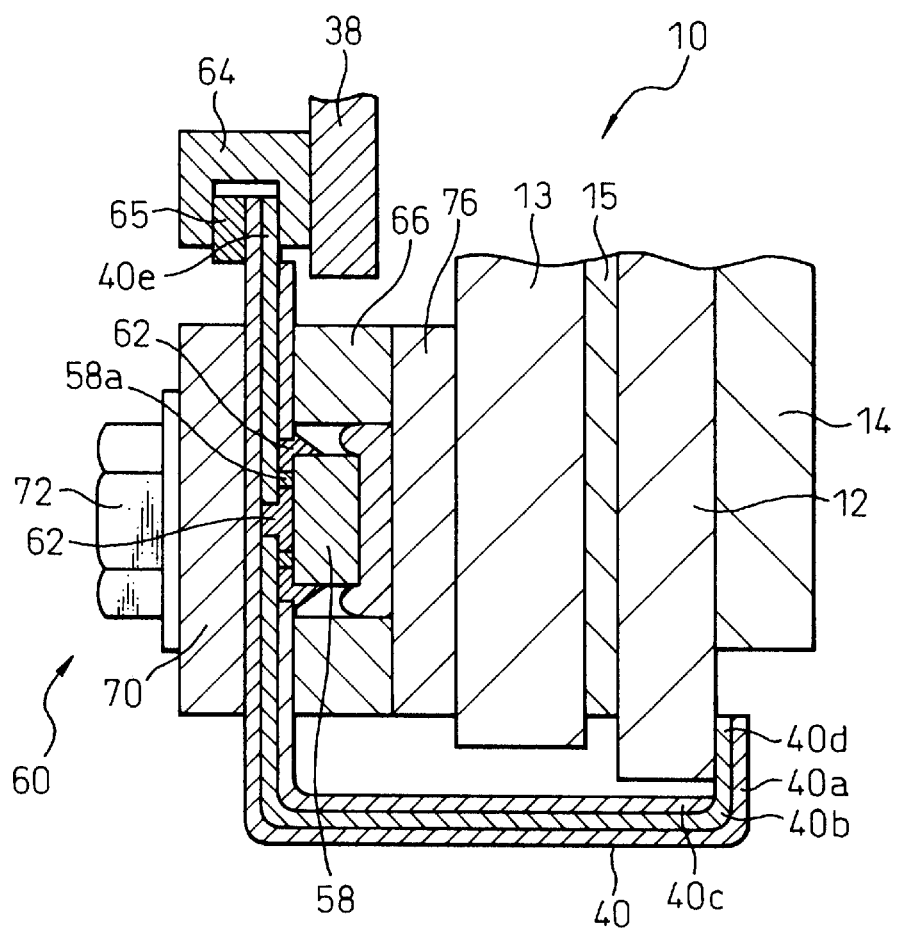
FIG. 12 is a sectional view showing in detail a part of the plasma display device including the driver IC module of FIG. 11.

FIG. 11 is a perspective view showing a driver IC module of the plasma display device according to a second embodiment of the invention. FIG. 12 is a sectional view showing in detail a part of the plasma display device including the driver IC module of FIG. 11. This embodiment is analogous to, but different from, the preceding embodiment in that a front plate 76 is attached to the protective plate 66. The driver IC module 60 is formed by the flexible printed circuit board 40, a plurality of the driver IC chips 58, the protective plate 66, a plurality of the resin sheets 68, the back plate 70 and the front plate 76, which are integrated together.

The protective plate 66 and the back plate 70 are fixed to the flexible printed circuit board 40 by an adhesive thereby to form a subassembly. The front plate 76 has the substantially same shape as the protective plate 66 and is superposed on the latter. The protective plate 66 and the back plate 70 have the screw insertion holes 66c, etc. and, further, have two through holes. The front plate 76 has screw insertion holes corresponding to the screw insertion hole 66c and threaded holes 76a corresponding to the through holes. Thus, the front plate 76 is integrated with the subassembly by inserting the screws through the protective plate 66 and the back plate 70 and screwing them into the threaded holes 76a of the front plate 76, thereby completing the driver IC module 60. The screws are not inserted through the front plate 76.

In the driver IC module 60, the resin sheet 68 is deformed to some degree and inserted between the corresponding driver IC chip 58 and the front plate 76. Then, the driver IC module 60 can be attached to the chassis 13 by the screws 72. After this attachment, the front plate 76 is located between the protective plate 66 and the chassis 13.

The heat generated by the driver IC chip 58 is transmitted to the chassis 13 through the corresponding resin sheet 68 and the front plate 76. The front plate 76, like the back plate 70, is formed of a metallic material such as aluminum and allows the driver IC module 60 to have an outer wall covered with the metallic material in its entirety. Thus, the driver IC module 60 can be handled easily.

Further, in the preceding embodiment, a multiplicity of resin sheets 68 are in contact with the chassis 13 and, therefore, it is difficult to maintain the interface between the resin sheets 68 and the chassis 13 without variation. In this embodiment, in contrast, the resin sheets 68 to be kept in contact delicately are fabricated by module in advance. Therefore, each driver IC chip 58, the corresponding resin sheet 68 and the front plate 76 are satisfactorily kept in a thermally coupled state, with each other, without variation. Further, the back plate 70 and the front plate 76 forming the driver IC module 60 are made of the metallic material, and therefore the noise shielding performance is improved. As a result, the protective plate 66 can be made of a metallic material or an insulating resin material, for example. By forming the protective plate 66 of the insulative resin material in this way, the protective plate 66 can be designed without considering the distance or intervals for insulation, thereby making it possible to meet the requirement of packaging the parts with a higher density.

Figure 13:
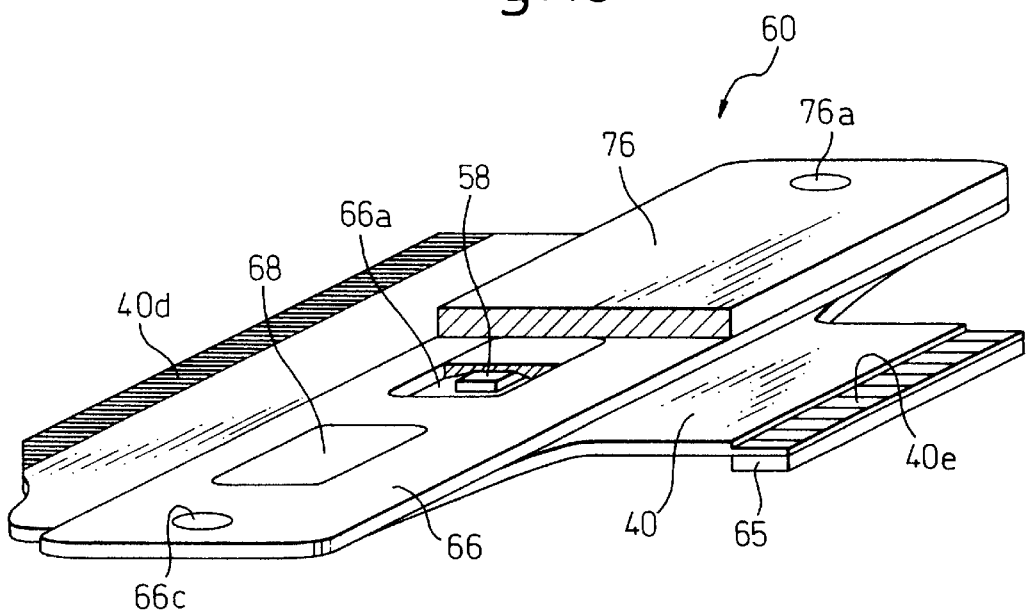
FIG. 13 is a perspective view showing the driver IC module of the plasma display device according to a third embodiment of the present invention.
Figure 14:
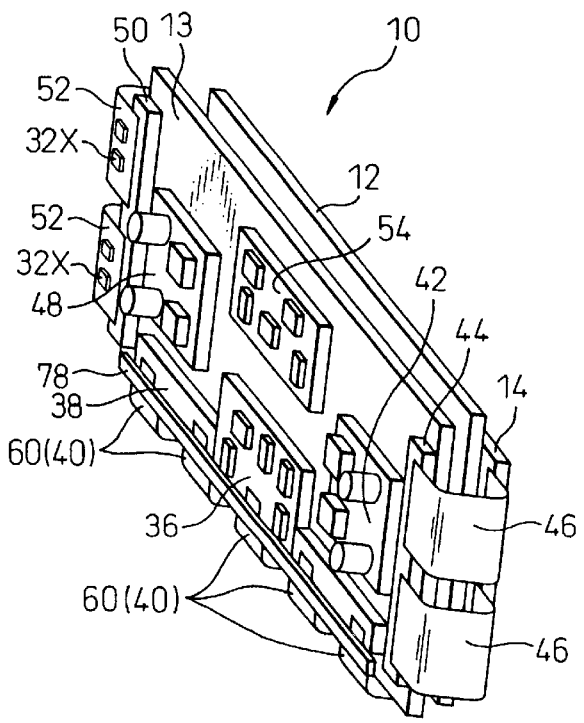
FIG. 14 is a perspective showing the plasma display device of FIG. 13.
Figure 15:
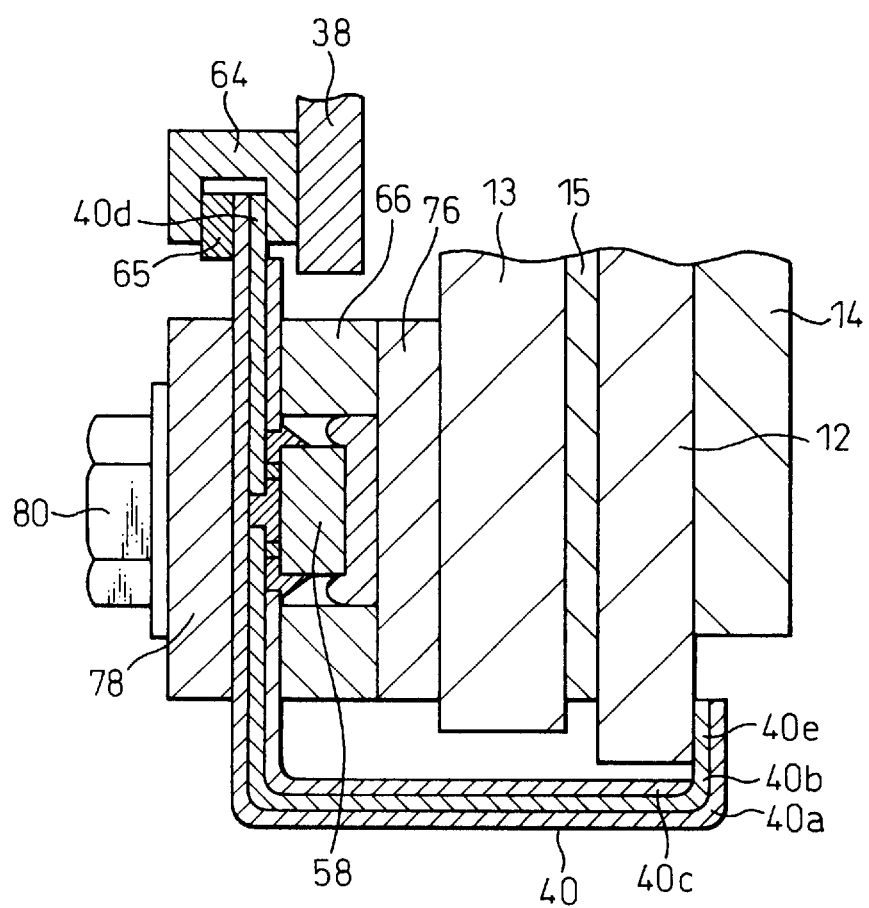
FIG. 15 is a sectional view showing in detail a part of the plasma display device including the driver IC module of FIG. 13.

FIG. 13 is a perspective view showing a driver IC module of the plasma display device according to a third embodiment of the invention. FIG. 14 is a perspective view showing the plasma display device of FIG. 13. FIG. 15 is a sectional view showing in detail a part of the plasma display device including the driver IC module of FIG. 13. This embodiment is analogous to but different from the second embodiment in that the back plate 70 is deleted. Thus, the driver IC module 60 comprises the flexible printed circuit board 40, a plurality of the driver IC chips 58, the protective plate 66, a plurality of the resin sheets 68, and the front plate 76, which are integrated together. The front plate 76 is fixed to the protective plate 66 by an adhesive.

As shown in FIG. 14, a plate 78 for fixing the driver IC module having substantially the same length as the long side of the chassis 13 is used to fix all the driver IC modules 60 on the chassis 13. The fixing plate 78, like the back plate 70 in the preceding embodiment, is arranged outside the flexible printed circuit board 40, and as in the case of the back plate 70, acts to press the flexible printed circuit board 40 toward the chassis 13. The fixing plate 78, however, is not incorporated in the driver IC module 60. Screws 80 are fitted in the threaded holes of the chassis 13 through the screw insertion holes 66c, so that the fixing plate 78 fixes the driver IC modules 60 to the chassis 13.

The operation of this embodiment is the same as that of the second embodiment. Since all the driver IC modules 60 can be fixed to the chassis 13 by the single fixing plate 78, however, the number of component parts can be reduced. The fixing plate 78 can be divided into several parts. As another alternative, the fixing plate 78 can be provided for each of the driver IC modules 60. Also in this case, the fixing plate 78 is not a component part of the driver IC module 60 but used for fixing the driver IC modules 60 to the chassis 13.

As described above, according to the present invention, the heat generated by the driver IC chips having a flip chip structure can be efficiently conducted to the chassis to thereby protect the driver IC chips.

Figure 16A:
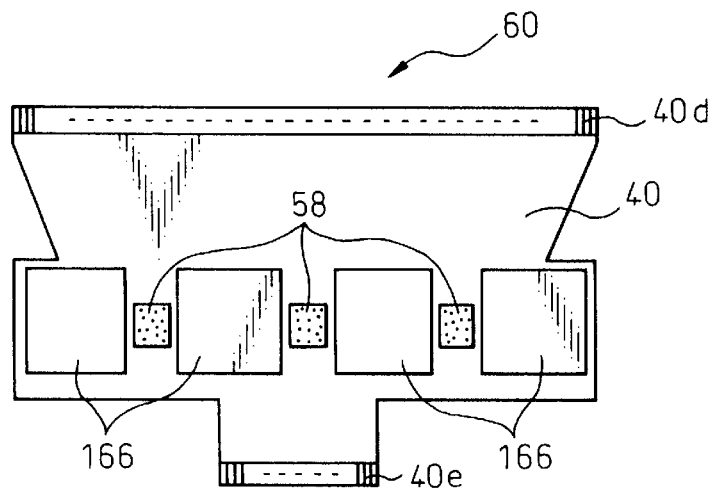
Figure 16B:
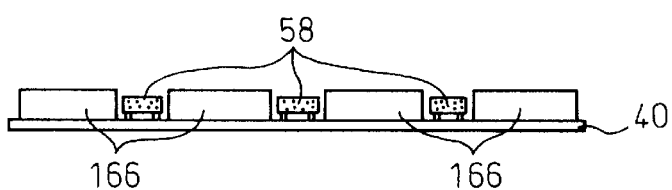
Figure 16C:
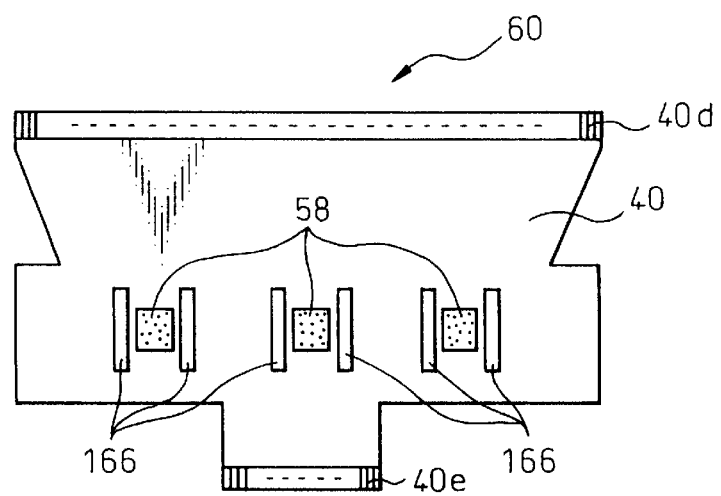
Figure 16D:
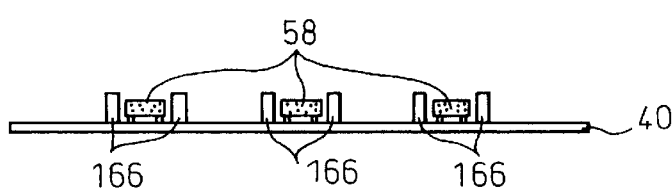

FIGS. 16A to 16D are views showing basic examples of a driver IC module of a plasma display device of the fourth embodiment of the present invention, wherein FIGS. 16A and 16C are plan views and FIGS. 16B and 16D are sectional views. IC chips 58 are connected to the flexible wiring board 40 by the method of gang-bonding as a flip chip mounting which is a face-down connection method.

In the connection method of flip chip mounting, the following methods are generally employed; one is a method in which gold bumps provided on terminals of the IC chip and a corresponding copper foil pattern of gold plating provided on the flexible wiring board 40 are collectingly connected to each other under heat and pressure by ACF (anisotropic electric conductive tape); the other is a gold-tin eutectic alloy method in which gold bumps provided on terminals of the IC chip and a copper foil pattern of tin plating provided on the flexible wiring board 40 are collectingly connected to each other under heat and in the same manner, so that an eutectic alloy of gold and tin is made in the connecting portion. In any method, the flip chip mounting is conducted so that a large number of terminals can be simultaneously connected all at once (gang-bonding), and therefore, the tact time of work can be reduced and the productivity can be enhanced, and the flip chip mounting is being used as a mounting method effective for reducing the manufacturing cost.

In some cases, the gang-bonding connecting portion is coated with protective resin if necessary like the case of the gold-tin eutectic alloy method so that the gang-bonding connecting portion can be protected from the peripheral environment.

The IC chip mounting connecting method can be applied to various fields and various uses. Especially, using the characteristic of the IC chip mounting connecting method in which the manufacturing cost can be reduced and a large scale of mass production can be realized, the IC chip mounting connecting method is being applied to a mounting structure for a driver IC module to drive panel electrodes of a flat panel display device.

There are some applicable flat panel display devices such as PDP described above, LCD, EL and so forth. In this specification, detailed explanations will be made regarding a case in which the IC chip mounting connecting method is applied to a drive IC module for driving panel electrodes for PDP, but the IC chip mounting connecting method can be applied to cases except for the above usage.

FIGS. 16A and 16B are views showing an example of the drive IC module 60 for the above described PDP, in which three driver IC chips 58 are mounted on the flexible wiring board (or circuit board) 40 by the face-down, gang-bonding method described above.

Each IC chip 58 comprises a Si elements having the height of approximately 0.5 mm, and has pad terminals for electrical connection with gold bumps provided on the terminals in advance, the height of which is approximately 10 $\mu$m.

The flexible wiring board 40 is composed in such a manner that a copper foil pattern is formed on a base film made of polyimide and the surface of base film is covered by a cover lay film or a resist material for electrical insulation so that the flexible board 40 has flexibility. Three IC chips 58 are connected to and mounted on the flexible wiring board 40 at regular intervals by means of gang-bonding.

The flexible wiring board 40 has an input terminal 40e for receiving a control signal from the outside device and an output terminal 40d for outputting a drive voltage from the driver ICs 58; the input terminal 40e is connected to the address bus substrate 38 of the display device, and the output terminal 40d is connected to the address electrodes 16 of the plasma display panel.

The material of the flexible board 40 may be one made as an individual form having a predetermined size, one made as a continuous tape, or another one although not particularly shown in the drawing, which uses a TAB mounting in which a TAB tape having device holes is used and IC chips 58 are mounted at the device holes by the face-down method.

Plate-shaped protective members 166 are attached to the flexible wiring board 40 at portions except for portions in which the driver IC chips 58 are mounted, adjacent to the two sides of the IC chips 58, to protect the IC chips 58. The protective members 166 comprise a plurality of small plate-like members and are aligned on a line connecting the IC chips 58.

The thickness of the protective member 166 is identical to or slightly greater than that of the driver IC chip 58, for example, approximately 0.7 mm. The protective member 166 is made of a material harder than the flexible wiring board 40, for example, the protective member 166 is made of a resin plate such as a glass epoxy plate or a metal plate such as an aluminum plate. The protective members 166 are bonded to the flexible wiring board in proximity to each IC chip 58.

Due to the provision of protective members 166, when the driver IC module 60 is handled by a hand of a human being, for example, the protective member 166, which is thicker and harder than the flexible wiring board 40, can be grasped by the hand, without directly touching the IC chip 58 by the hand, it becomes possible to stably handle the driver IC module 60. Therefore, it is possible to prevent occurrence of contamination and defects such as damage or crack of the IC chip 58, which might occur when the hand touches the IC chip.

Also, when the driver IC module 60 is handled by a suction nozzle of an automatic machine, the suction nozzle can stably and positively attract and fix the protective member 166, due to the provision of protective member 166. Since the suction nozzle does not come into contact with the IC chip 58, it is possible to prevent occurrence of contamination and defects such as damage or crack of the IC chip 58.

Also, the flexible wiring board 40 is thin, the protective member 166 also functions as a member to reinforce the flexible wiring board 40. Also, in the case of a resist film type flexible wiring board 40 in which the cover film is not provided but a resist material is coated as an insulating film covering the copper foil surface, the thickness of the resist film is restricted and occurrence of defects such as minute pin holes are unavoidable, and in such a case, the protective member 166 used in this case can function as a member to strengthen the insulation with respect to the defects caused by the resist film.

It is possible to variously modify the protective member 166, for example, it is possible to form a hole or a protrusion, which is used for attaching the driver IC module 60 onto the display device.

FIGS. 16C and 16D shows a variation of the driver IC module 60 of FIGS. 16A and 16B, in which the size of the protective members 166 are made as small as possible, and the protective members 166 are arranged only in neighborhood of the IC chips 58. In the case where the protective members 166 are thicker and harder, it is possible to sufficiently protect the IC chips 58 in the similar manner to the previous case, by arranging the protective members 166 only at the positions near and around the IC chips 58.

Figure 17A:
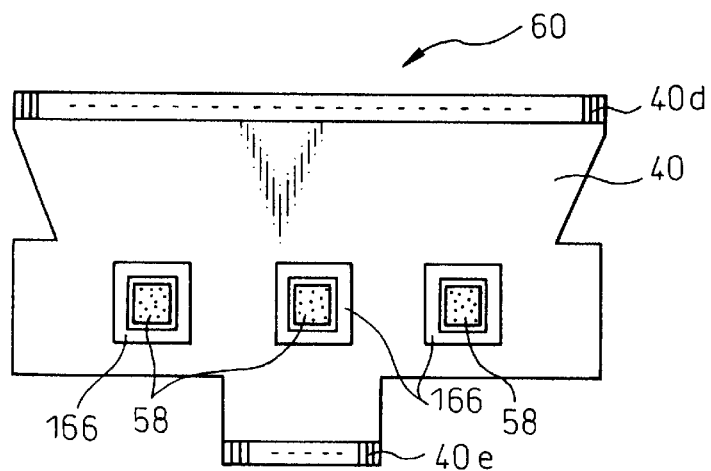
Figure 17B:
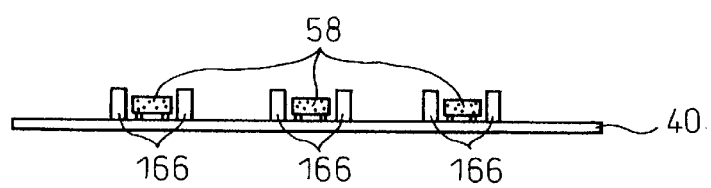

FIGS. 17A and 17B shows another variation of the driver IC module 60 of FIGS. 16A and 16B, in which FIG. 17A is a plan view and FIG. 17B is a sectional view. In this example, the protective members 166 are arranged to surround the IC chips 58. Each IC chip 59 is completely surrounded by the protective member 166, and the protecting effect is further enhanced, rather than those of FIGS. 16C and 16D.

Figure 17C:
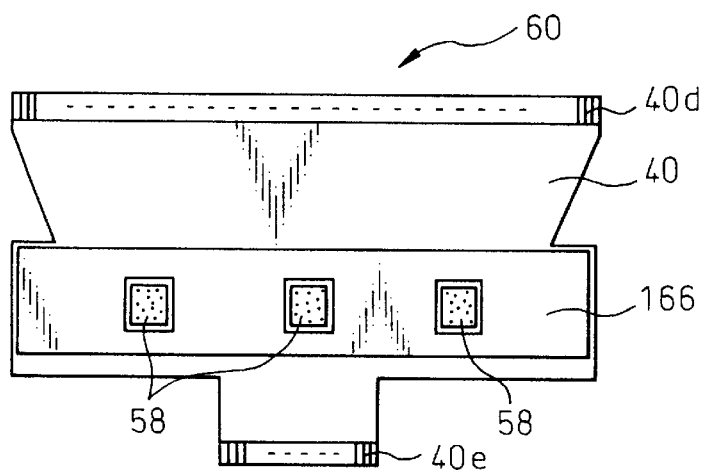
Figure 17D:
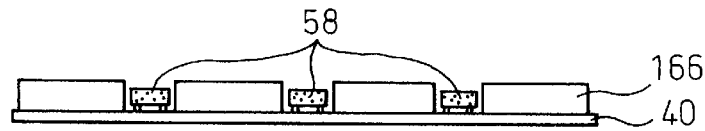

FIGS. 17C and 17D are views showing a further variation of the driver IC module 60 shown in FIGS. 16A and 16B. FIG. 17A is a plan view, and FIG. 17B is a sectional view. In the same manner as that of the example shown in FIGS. 16A and 16B, the protective member 166 is provided on the flexible wiring board 40. In this case, the protective member 166 comprises one big plate, which completely surrounds the outer periphery of each driver IC chip 58 and is bonded to the flexible wiring board 40. The width of the protective member 166 is approximately identical to the width of the flexible wiring board 40. In this embodiment, the outer periphery of each driver IC chip 58 is completely surrounded by the protective member 166, and therefore, when the driver IC module 60 is, handled in various ways, the occurrence of defects such as damage or crack of the IC chip 58 can be more stably and positively prevented, and further the protection for the flexible wiring board 40 can be more strengthened. Also, the driver IC module 60 can resist a bending force given from the outside to the IC chip 58 near the outer periphery thereof, and therefore, the protective member 166 is effective for reinforcing the terminals of the IC chips 58 at the gang-bonding portions.

Figure 18A:
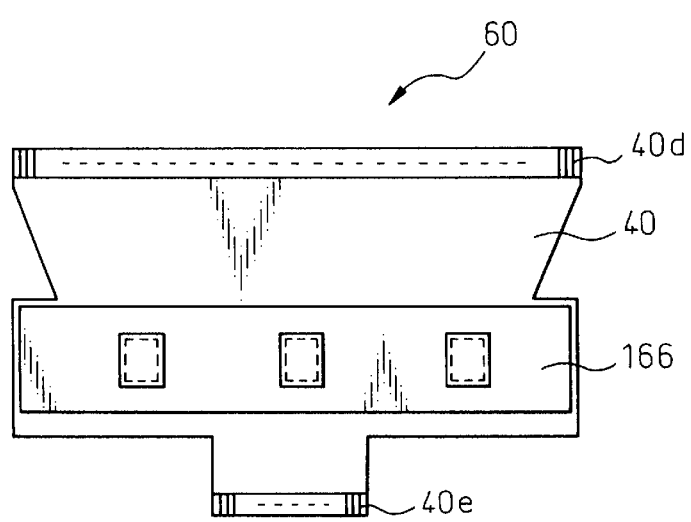
Figure 18B:
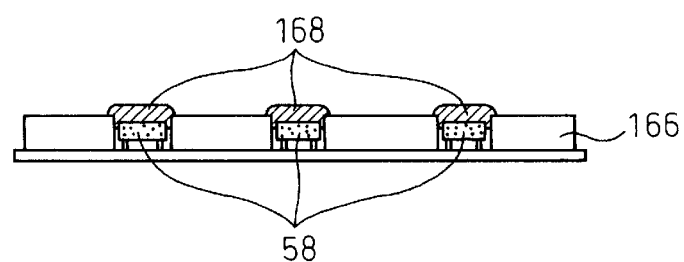

FIGS. 18A and 18B are views showing a variation of the driver IC module shown in FIGS. 16A and 16B. FIG. 18A is a plan view, and FIG. 18B is a sectional view. The structure of the driver IC module 60 shown in FIGS. 18A and 18B is different from the driver IC module 60 shown in FIGS. 16A to 17D, in that there is provided a resin member 168 on the back of each IC chip 58 so that the resin member 168 can cover the IC chip 58. The circumference of each IC chip 58 is almost completely covered by the resin member 168 and the protective member 166, so that it is possible to completely prevent the driver IC module 60 from damage caused by a mechanical force given from the outside and contamination caused by deposition of stain and ingress of moisture.

Concerning the material of the resin member 168, it is possible to use various materials. For example, it is possible to use liquid epoxy resin which is coated in the opening of the protective member 166 and then hardened, or a silicon resin of rubber which exhibits flexibility after the completion of hardening. In the case where the silicon resin is used for the resin member 168, there is a type of silicon resin which is formed into a sheet-shape in advance, and in this case, the sheet-shaped silicon resin is cut into a size of the opening portion of the protective member 166 in which the IC chip 58 is accommodated and the thus cut sheet-shaped silicon resin is bonded to the opening portion of the protective member 166.

In the case where the heat radiating property for the IC chip 58 is to be considered, it is possible to use one in which the heat radiating property of the resin member 168 is enhanced by mixing a material of high heat conductivity such as ceramics with the resin member 168. The thickness of the resin member 168 can be arbitrarily determined. However, when flexible silicon resin or a sheet type resin is used, the thickness of the resin member 168 is determined so that the thickness of the resin member 168 is a little larger than the height of the protective member 166 on the flexible wiring board 40. Due to the foregoing, when a heat radiating plate made of metal is contacted and attached by fusion onto the surface of the resin member or a heat radiating plate made of metal is bonded onto the surface of the resin member, heat generated by the IC chip 58 can be easily radiated to the heat radiating plate via the resin member, so that the heat radiating property can be enhanced.

Figure 19A:
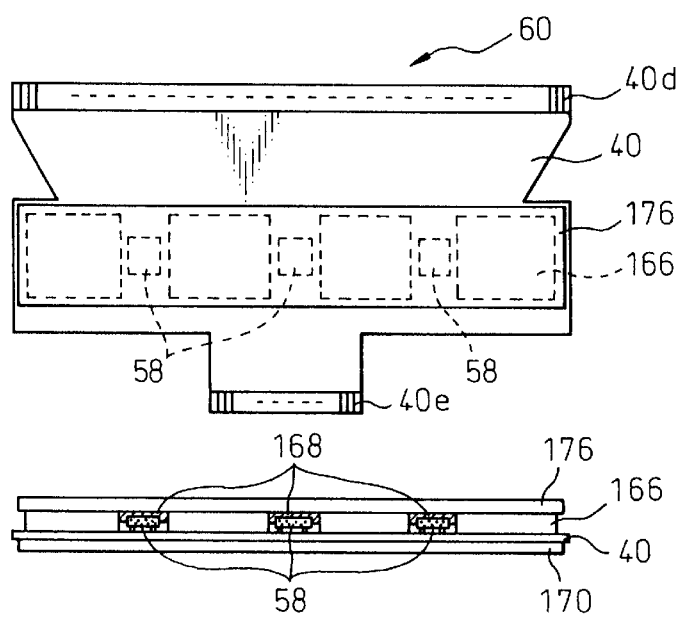
Figure 19B:
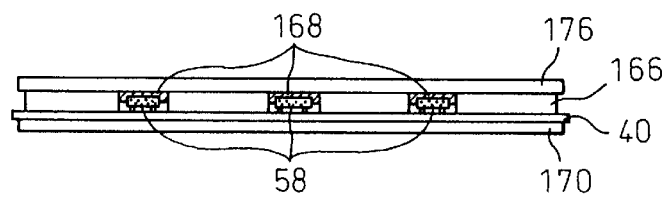
Figure 20A:
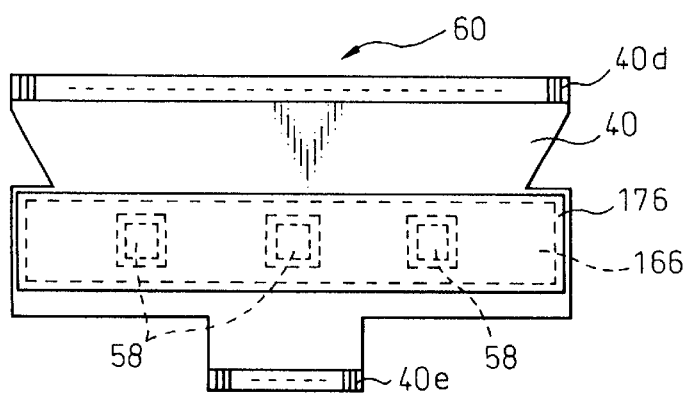
Figure 20B:
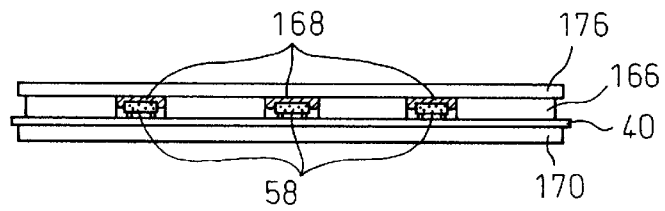

FIGS. 19A and 19B are views showing a driver IC module of the plasma display device of the fifth embodiment of the present invention. FIG. 19A is a plan view, and FIG. 19B is a sectional view. FIGS. 20A and 20B are views showing a variation of the driver IC module shown in FIGS. 19A and 19B. FIG. 20A is a plan view, and FIG. 20B is a sectional view. AS shown in FIGS. 19A to 20B, the heat radiating plate 176 covers the protective member (or members) 166 and is bonded to the protective member 166. The resin member 168 covers the IC chip 58 and is covered by the heat radiating plate 176. A back plate 170 is attached to the back surface of the flexible wiring board 40. The shape of the protective member 166 shown in FIGS. 19A and 19B is the same as that of the protective member 166 shown in FIGS. 16A and 16B. The shape of the protective member 166 shown in FIGS. 20A and 20B is the same as that of the protective member 166 shown in FIGS. 17C and 17D. As described above, the protection for the IC chip can be further strengthened, and the heat radiating capacity can be increased so that the heat generated by the IC chip 58 can be radiated. The heat radiating plate 176 is made to adhere to the protective member 166 by adhesive resin. In this case, the thickness of the protective member 166 is made to be a little larger than the thickness of the IC chip 58. For example, when the thickness of the IC chip 58 is 0.5 mm, the thickness of the protective member 166 is determined at about 0.7 mm. The heat radiating plate 176 is made of metal such as aluminum, and the thickness is determined at about 2 mm.

When the resin member 168 having high heat conductivity, is inserted into a gap between the heat radiating plate 176 and the back of the IC chip 58, heat can be easily transmitted from the IC chip 58 to the heat radiating plate 176. Since the heat radiating plate 176 is provided in this way, the IC chip 58 can be completely covered, and therefore, not only the IC chip 58 can be completely protected from a mechanical damage but also the IC chip 58 can be almost completely prevented from stain and intrusion of moisture. Further, the heat radiating capacity of heat generated by the IC chip 58 can be remarkably improved. Therefore, it becomes possible to realize the most appropriate structure for the driver IC module 60 of a large electric power consumption.

Further, in the case where the heat radiating plate 176 is made of metal, since the heat radiating plate 176 covers the entire IC chip 58 which tends to become a source of generating electromagnetic noise, electromagnetic noise can be prevented from leaking outside.

Further, the back support plate 170 is arranged on the back of the flexible wiring board 40 with respect to the face on which the driver IC chip 58 is mounted. Therefore, the support plate 170 functions as a support member for supporting and reinforcing the entire component including the flexible wiring board 40. The back plate 170 can be made of a resin plate such as a glass epoxy plate and also the support plate 170 can be made of a metal plate such as an aluminum plate. The thickness of the support plate 170 is, for example, about 2 mm. The support plate 170 may be bonded to the flexible wiring board 40 with adhesive resin. Alternatively, the support plate 170 may be mechanically attached to the heat radiating plate with screws.

When the support plate 170 made of metal is used, the IC chip 58 is completely interposed between the support plate 170 and the heat radiating plate 176. Therefore, leakage of electromagnetic noise to the outside can be almost completely prevented. However, the support plate 170 is not necessarily used depending upon the way of handling conducted on the driver IC module 60 and also depending upon the frequency of handling motions conducted on the driver IC module 60 and the structure of the display device. If no problems are caused in electromagnetic noise, it is preferable to use a resin plate, the weight of which is lighter than that of a metallic plate. Although not particularly shown in the drawing, through-holes can be formed from the heat radiating plate 176 to the support plate 170 so that the through-holes can be used as holes for attaching the module to the display set.

Figure 21A:
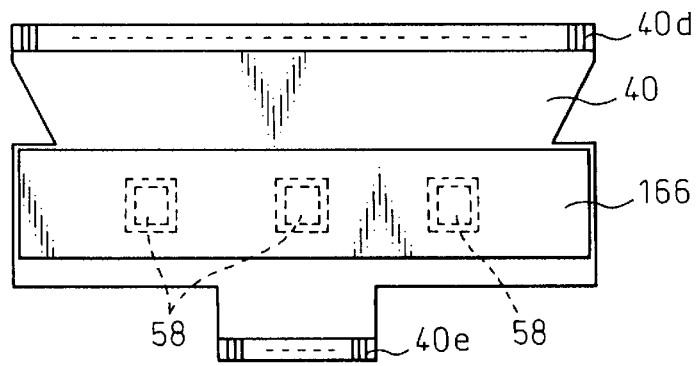
Figure 21B:
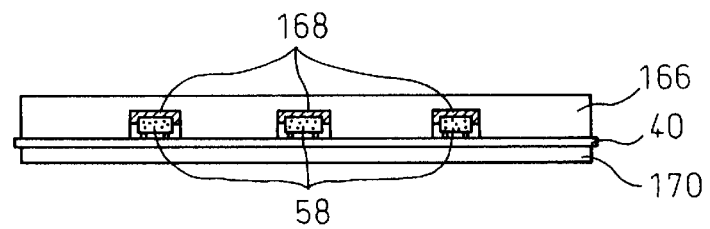

FIGS. 21A and 21B are views showing a variation of the driver IC module 60 shown in FIGS. 19A and 19B. FIG. 21A is a plan view, and FIG. 21B is a sectional view. In this example, the protective member 166 functions as both the protective member 166 and the heat radiating plate 176 which are shown in the example of FIGS. 20A and 20B. In this structure, the number of parts is reduced. Therefore, the manufacturing cost can be reduced. The protective member 166 is composed of a metallic member such as an aluminum member. The size of the protective member 166 is larger than the size (length×width×thickness) of the IC chip, and a recess is formed in the protective member 166 at a position corresponding to the position at which IC chip is mounted. Adhesive resin, which is a heat conductive resin, is coated in this recess in the protective member 166. Alternatively, a resin sheet is put into the recess. Further, adhesive resin is coated or made to adhere onto the back of the IC chip. After that, the IC chip 58 and the resin member 168 are accommodated in the recess of the protective member 166 and bonded to the flexible wiring board 40.

In the structure shown in FIGS. 21A and 21B, it is unnecessary to provide a protective member 166 which is formed differently from the heat radiating plate 176 as shown in FIGS. 20A to 21B. Therefore, it becomes possible to realize a driver IC module, the number of parts of which is decreased so that the manufacturing cost can be reduced, and the heat radiating performance of which is high. The back plate 170 is composed of a resin plate or metallic plate in the same manner, however, the support plate 170 may not be necessarily used. If the support plate 170 is used, it can be fixed by adhesive resin or screws. When the means of screwing is used, assembling work can be conducted without using adhesive resin.

Figure 22A:
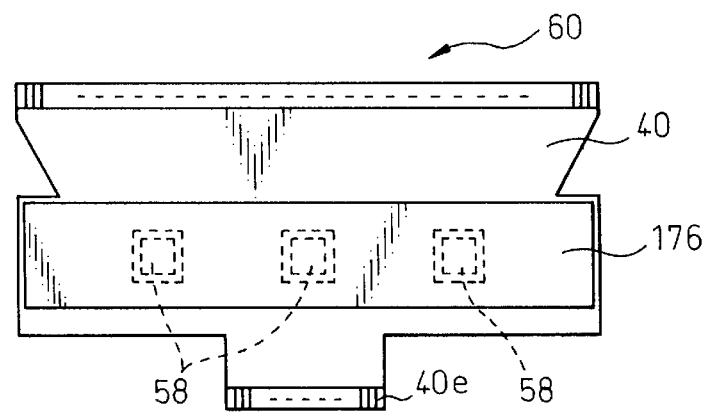
Figure 22B:
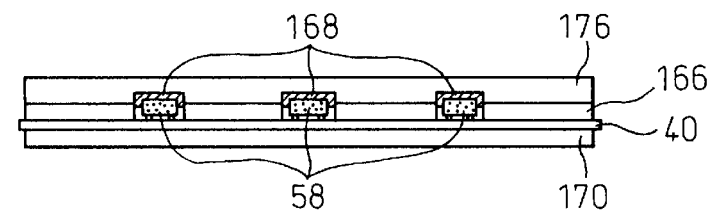

FIGS. 22A and 22B are views showing a variation of the driver IC module shown in FIGS. 19A and 19B. FIG. 22A is a plan view, and FIG. 22B is a sectional view. The flexible wiring board 40 is provided with the protective member 166 and also provided with a space for surrounding each IC chip 58. On the heat radiating plate 176, there is provided a recess for accommodating the IC chip 58. In this case, the thickness of the protective member 166 is smaller than the thickness of the IC chip 58. For example, the thickness of the protective member 166 is about 0.3 mm, and the protective member 166 is bonded onto the flexible wiring board 40. As a result, a portion of the IC chip 58 provided on the flexible wiring board 40 protrudes from the protective member 166. However, this protruding portion is accommodated in the recess of the heat radiating plate 176, and the protective member 166 is bonded to the heat radiating plate 176. In this structure, when the size of the IC chip accommodating portion in the heat radiating plate 176 is optimized according to the thickness of the protective member 166, it becomes possible to realize the most optimized structure for both aspects of the protection for protecting the IC chip 176 and the heat radiating property.

Figure 23:
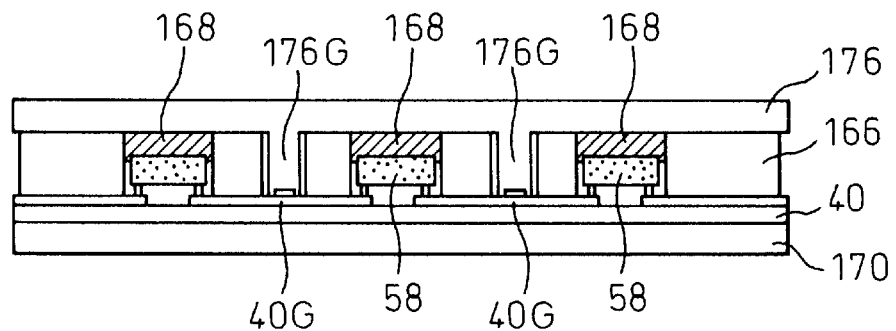
FIG. 23 is a sectional view showing the driver IC module of the plasma display device according to a sixth embodiment of the present invention.

FIG. 23 is a sectional view showing a driver IC module of the plasma display device of the sixth embodiment of the present invention. This embodiment is composed in such a manner that the heat radiating plate 176 or the support plate 170 is electrically connected to the earth wiring pattern on the flexible wiring board 40 with respect to the driver IC module 60 including the heat radiating plate 176 or the support plate 170 shown in FIGS. 16A to 18B.

Usually, the IC chip 58 is provided with a GND terminal for giving the reference electric potential level. This GND terminal is connected to the GND wiring on the address bus substrate 38, which is a circuit board provided on the device side, via the earth wiring pattern on the flexible wiring board 40. In this case, a portion of the earth wiring pattern of the flexible wiring board 40 is shown by 40G.

In this example, GND connection with respect to the GND terminal of the IC chip 58 is conducted by not only the earth wiring pattern on the flexible wiring board 40 but also the frame GND on the device side incorporated via the heat radiating plate 176 or the support plate 170. Therefore, the IC chip 58 can be grounded by GND grounding at lower impedance. Accordingly, it is possible to prevent the occurrence of malfunction and erroneous display caused when noise is mixed, and further it is possible to reduce the leakage of electromagnetic waves to the outside.

In the structure shown in FIG. 23, an electrical connection can be attained in such a manner that the protrusion 176G is provided in a portion of the heat radiating plate 176, for example, in a middle portion of the two IC chips 58, and the earth wiring pattern 40G on the flexible wiring board 40 is made to come into contact with this protrusion 176G. Therefore, from the connecting portion with the heat radiating plate 176 on the flexible wiring board 40, the insulating material such as a cover lay film or resist film provided on the surface of the connecting portion is previously removed. Therefore, it is possible to positively conduct a connection by means of adhesion in which electrical conductive adhesive is coated or by means of pressure connection conducted by mechanical calking. In this case, a portion on the protective member 166 corresponding to the protrusion 176G on the heat radiating plate 176 is previously removed.

Figure 24:
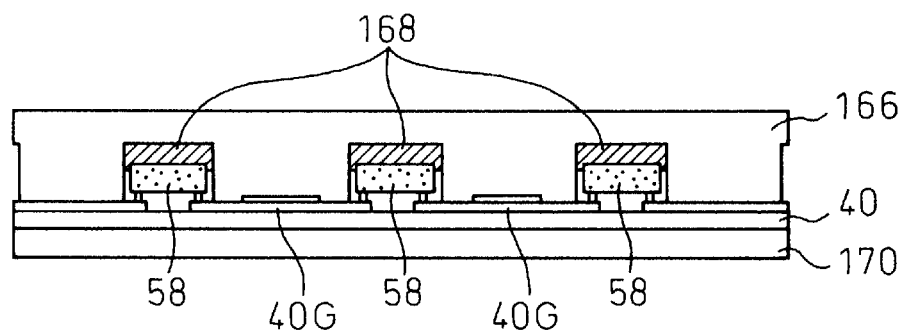
FIG. 24 is a sectional view showing a variation of the driver IC module shown in FIG. 23.

FIG. 24 is a sectional view showing a variation of the driver IC module shown in FIG. 23. In this structure, in the same manner as that of the protective member 166 shown in FIGS. 21A and 21B, the protective member 166 also functions as the heat radiating plate 176. In this example, the protective member 166 and the earth wiring pattern 40G on the flexible wiring board 40 are electrically connected to each other. In this structure, it is unnecessary to provide a heat radiating plate. Since the original protective member 166 itself is contacted with and bonded onto the flexible wiring board 40, it is easy to ensure an area for earth connection.

Figure 25:
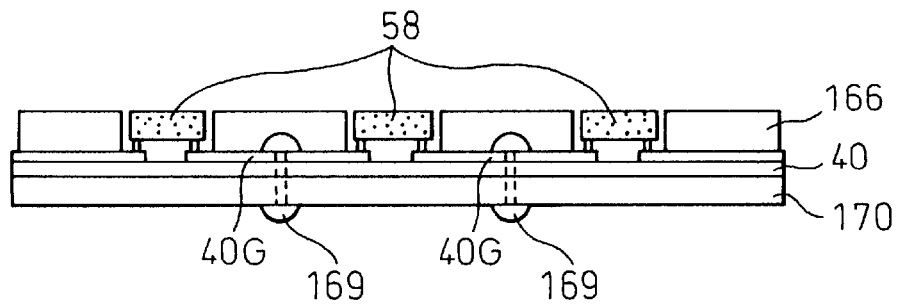
FIG. 25 is a sectional view showing a variation of the driver IC module shown in FIG. 23.

FIG. 25 is a sectional view showing a variation of the driver IC module shown in FIG. 23. In this example, the heat radiating plate and the earth wiring pattern 40G on the flexible wiring board 40 are not connected to each other but the support plate 170 provided on the back of the flexible wiring board 40 is composed of a metallic plate, and this support plate 170 and the earth wiring pattern 40G on the flexible wiring board 40 are electrically connected to each other.

In this case, the way of connection is described as follows. With rivet-shaped metallic fittings 169, the earth wiring pattern 40G on the flexible wiring board 40 and the support plate 170 are mechanically connected to each other by means of calking or alternatively by means of soldering by using special solder. Although not particularly shown in the drawing, with respect to the structure corresponding to the structure shown in FIGS. 22A and 22B, the heat radiating plate and the earth wiring pattern can be connected to each other in the same manner. Of course, it is possible to conduct a connecting processing with the earth wiring pattern on both the heat radiating plate and the support plate corresponding to the structures respectively shown in FIGS. 19A to 22B.

Figure 26:
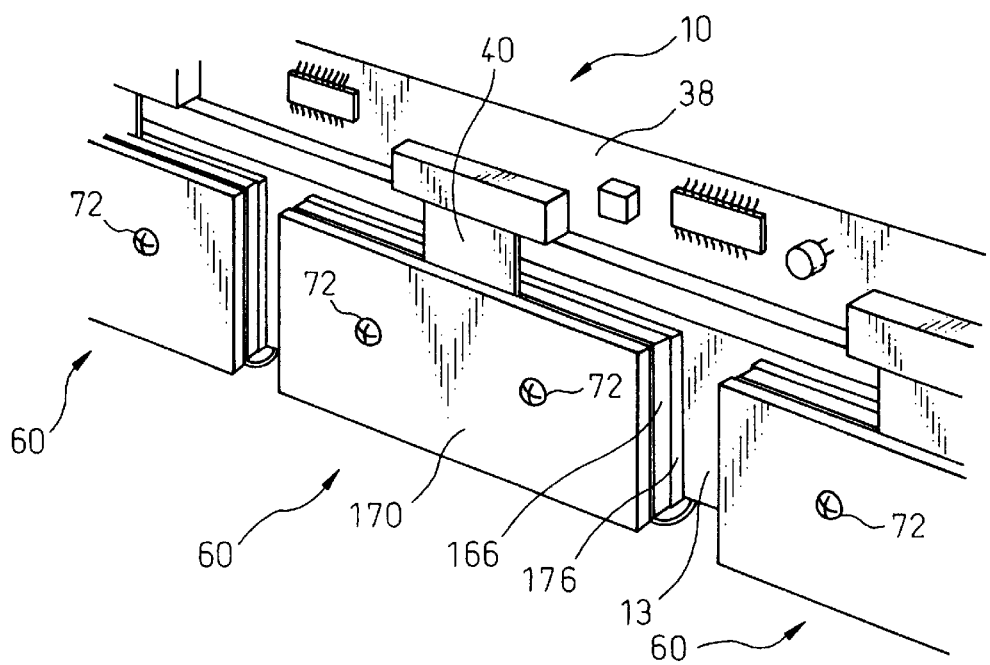
FIG. 26 is a perspective view showing a portion of the plasma display device including the driver IC module shown in FIGS. 19A and 19B.
Figure 27:
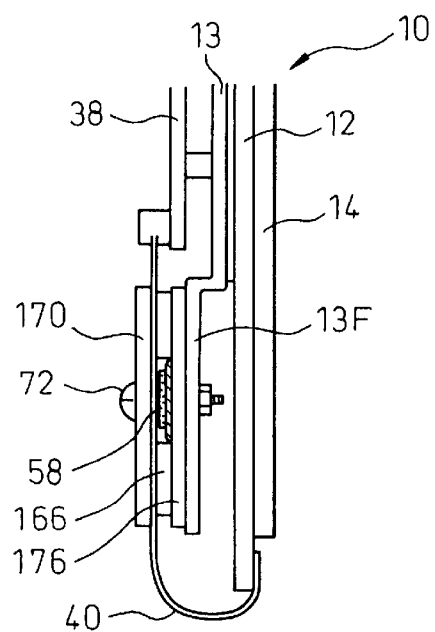
FIG. 27 is a sectional view showing the plasma display device shown in FIG. 26.

FIG. 26 is a perspective view showing a portion of the plasma display device including the driver IC module shown in FIG. 19A and 19B. FIG. 27 is a sectional view showing the plasma display device shown in FIG. 26.

The chassis 13 made of a metallic plate such as an aluminum plate is bonded to the back of the plasma display panel so that the fragile glass substrate 12 can be reinforced and the boards of a control circuit and electric power source circuit can be held. An end portion of the chassis 13 close to the address electrode is bent into a Z-shape so that the flat portion 13F can be formed, leaving a small gap between the flat portion 13F and the panel surface. This flat portion 13F of the chassis 13 is closely contacted with and tightly attached to the heat radiating plate 176 of the driver IC module 60.

When the heat radiating plate 176 is closely contacted with and tightly attached to the chassis 13 as described above, heat generated by the IC chip 58 can be easily transmitted from the heat conductive resin member 168 to the chassis 13 via the heat radiating plate 176. Therefore, it becomes possible to provide a display device, the heat radiating performance of which is excellent.

The driver IC module 60 can be fixed by various methods. In the case where the driver IC module 60 is fixed by screws as shown in the drawing, it is ideal to set the screws at positions close to the center, for example, it is ideal to set the screws at positions on both sides of the central IC chip 58, however, the screws may be set at positions at both end portions of the module depending upon a case.

In the case where a panel size is relatively small and an electric power consumption is not so large when it is driven, it is unnecessary to attach importance to the heat radiating performance. Therefore, it is unnecessary to adopt the above fixing method in which the heat radiating plate is made to come into surface contact with the chassis and fixed to it.

For example, it is also possible to adopt a method in which a boss used for fixation is provided on the end surface of the chassis 13 and the driver IC module is fixed with screws. An output terminal of the driver IC module is electrically connected to the address terminal, which is arranged at a lower end portion of the panel, by means of thermocompression bonding by using ACF (anisotropic electric conductive film). Holes into which the screws 72 are inserted can be appropriately formed in the support plate 170, the flexible wiring board 40, the protective member 166, the heat radiating plate 176 and the chassis 13.

Figure 28:
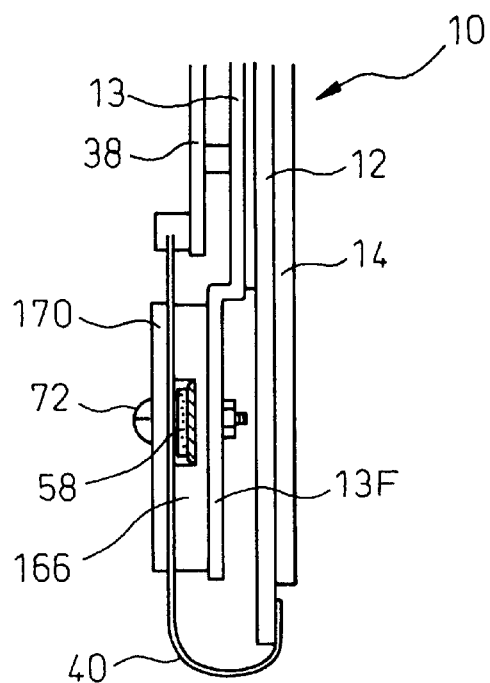
FIG. 28 is a sectional view showing a variation of the plasma display device shown in FIG. 27.
Figure 29:
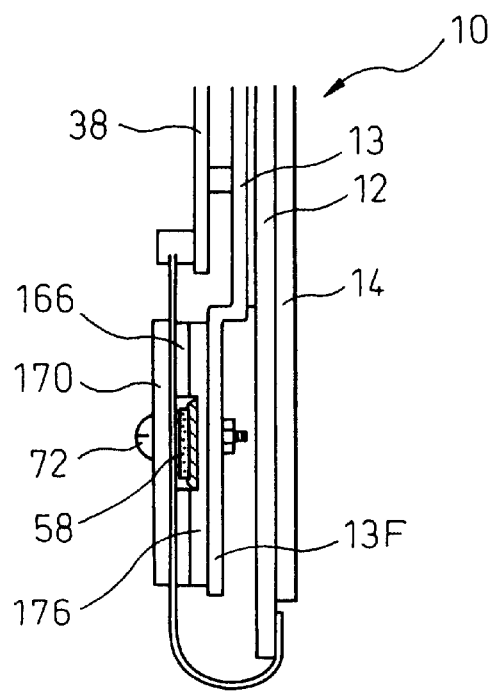
FIG. 29 is a sectional view showing a variation of the plasma display device shown in FIG. 27.

FIGS. 28 and 29 are sectional views respectively showing variations of the plasma display device shown in FIG. 27. FIG. 28 is a view showing an example in which the driver IC module 60 shown in FIGS. 21A and 21B is attached to the chassis 13, and FIG. 29 is a view showing an example in which the driver IC module 60 shown in FIGS. 22A and 21B is attached to the chassis 13.

Figure 30:
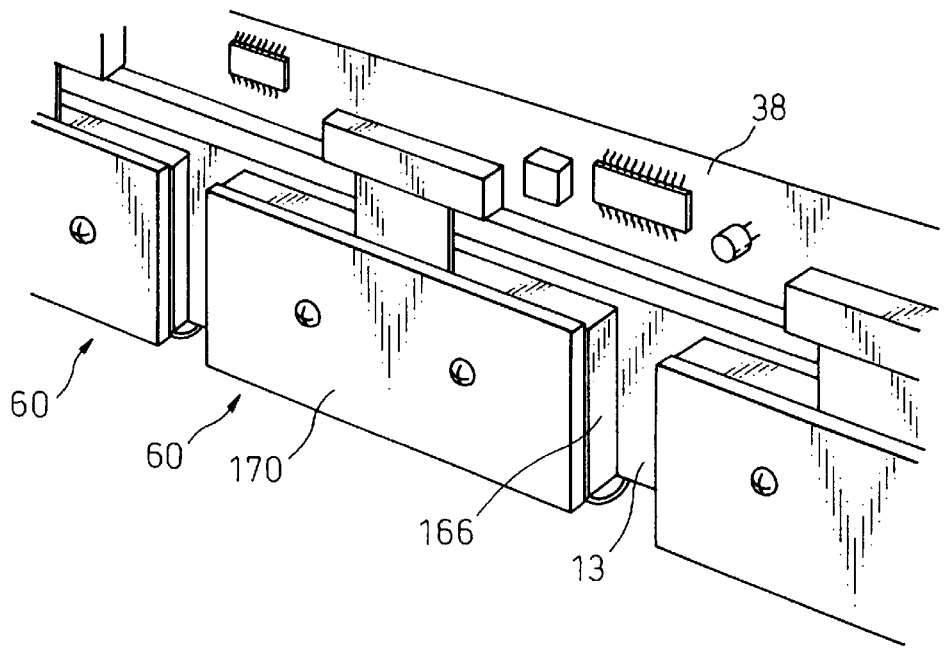
FIG. 30 is a perspective view showing a portion of the plasma display device including the driver IC module shown in FIG. 17.
Figure 31:
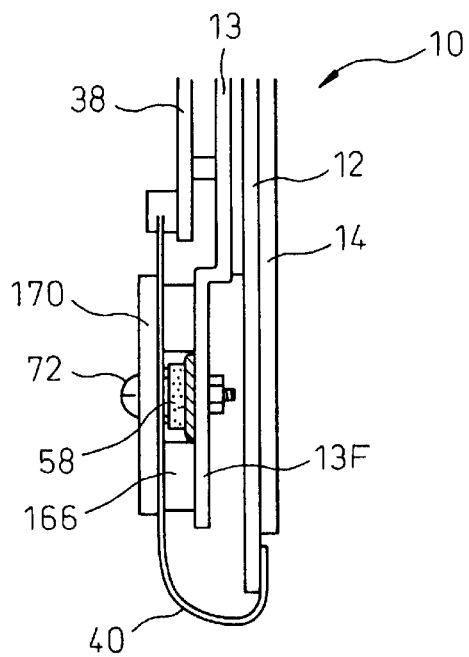
FIG. 31 is a sectional view showing the plasma display device shown in FIG. 30.

FIG. 30 is a perspective view showing a portion of the plasma display device including the driver IC module shown in FIG. 16 or 17. FIG. 31 is a sectional view showing the plasma display device shown in FIG. 30. In this embodiment, the most appropriate driver constitution as a total system of the entire flat display device is provided. In this embodiment, there is provided a mounting construction in which the number of parts is reduced so that the device can be downsized and the structure is simplified and further the performance of the device is excellent. That is, the chassis 13 arranged on the back of the panel is assumed to be a heat radiating plate of the driver IC module 60, and this is utilized and put into practical use. In the structures shown in FIGS. 30 and 31, the heat radiating plates 176 shown in FIGS. 26 to 29 are omitted, and a portion 13F of the chassis 13 functions as a heat radiating plate 176.

Figure 32:
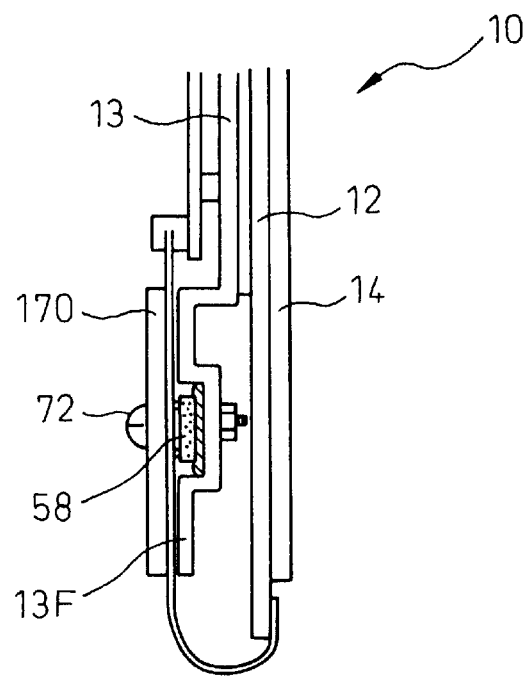
FIG. 32 is a sectional view showing a variation of the plasma display device shown in FIG. 31.
Figure 33:
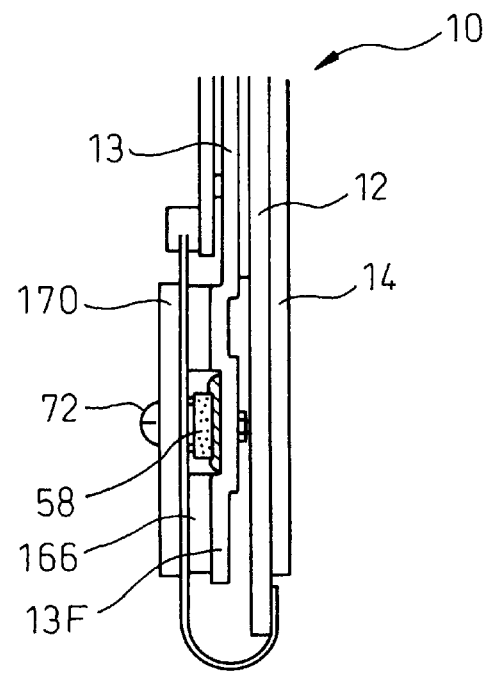
FIG. 33 is a sectional view showing a variation of the plasma display device shown in FIG. 31.

FIG. 32 is a sectional view showing a variation of the plasma display device shown in FIG. 31. FIG. 33 is a sectional view showing a variation of the plasma display device shown in FIG. 31. FIG. 32 is a view showing an example in which the driver IC module 60 shown in FIG. 21 or 25 is attached to the chassis 60. FIG. 33 is a view showing an example in which the driver IC module 60 shown in FIG. 22 is attached to the chassis 60.

Figure 34:
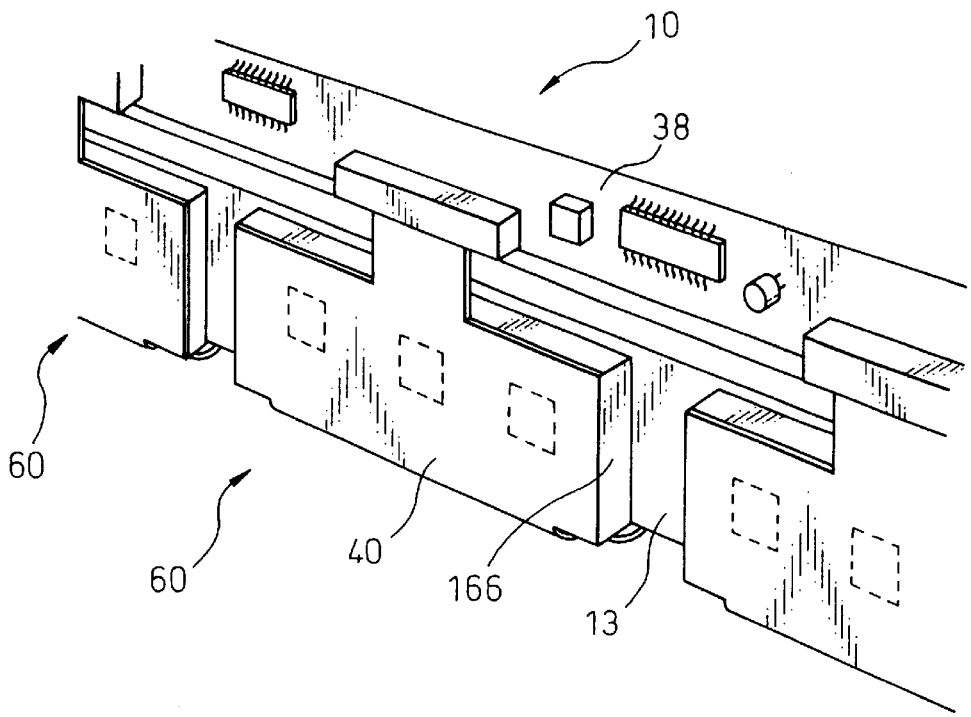
FIG. 34 is a perspective view showing a variation of the plasma display device shown in FIG. 30.
Figure 35:
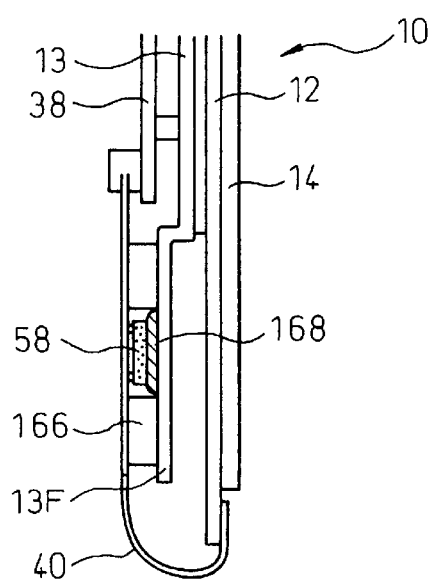
FIG. 35 is a sectional view showing the plasma display device shown in FIG. 34.

FIG. 34 is a perspective view showing a variation of the plasma display device shown in FIG. 30. FIG. 35 is a sectional view showing the plasma display device shown in FIG. 34. In this embodiment, the support plate 170 shown in FIG. 30 is not used, and the structure is further simplified so as to reduce the manufacturing cost. In this embodiment, there is shown a method in which the driver IC module 60 is fixed to and held by the chassis 13 only by adhesive resin.

Figure 36:
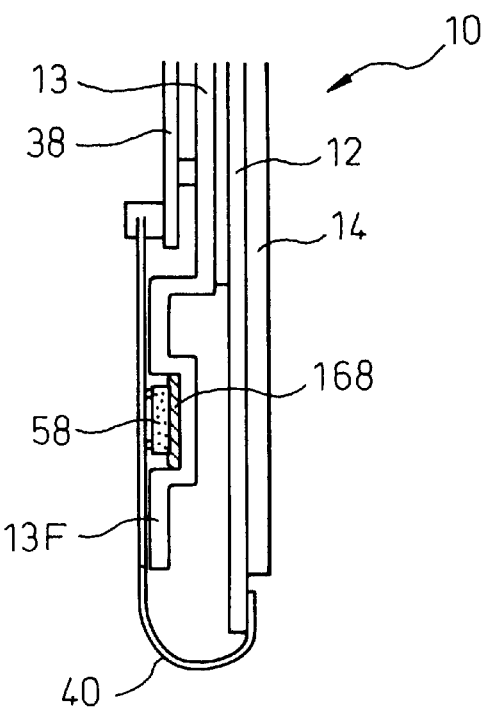
FIG. 36 is a sectional view showing a variation of the plasma display device shown in FIG. 35.

FIG. 36 is a sectional view showing a variation of the plasma display device shown in FIG. 35. In this example, a portion 13F of the chassis 13 functions as a protective member 166.

Figure 37:
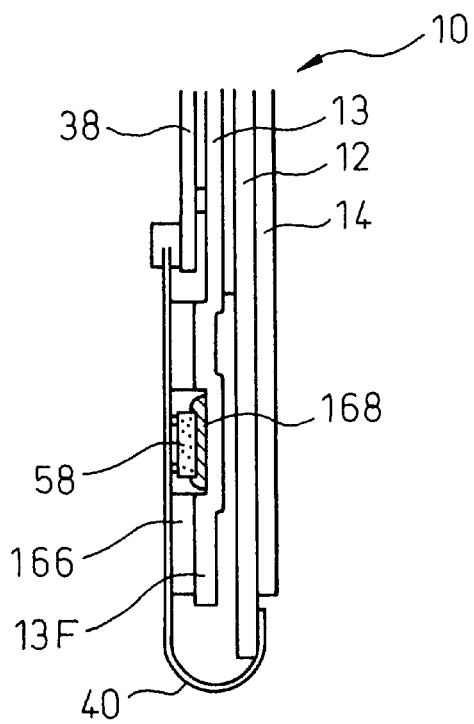
FIG. 37 is a sectional view showing a variation of the plasma display device shown in FIG. 35.

FIG. 37 is a sectional view showing a variation of the plasma display device shown in FIG. 35. In this example, a portion 13F of the chassis 13 functions as a heat radiating plate 176 shown in FIG. 22.

Figure 38:
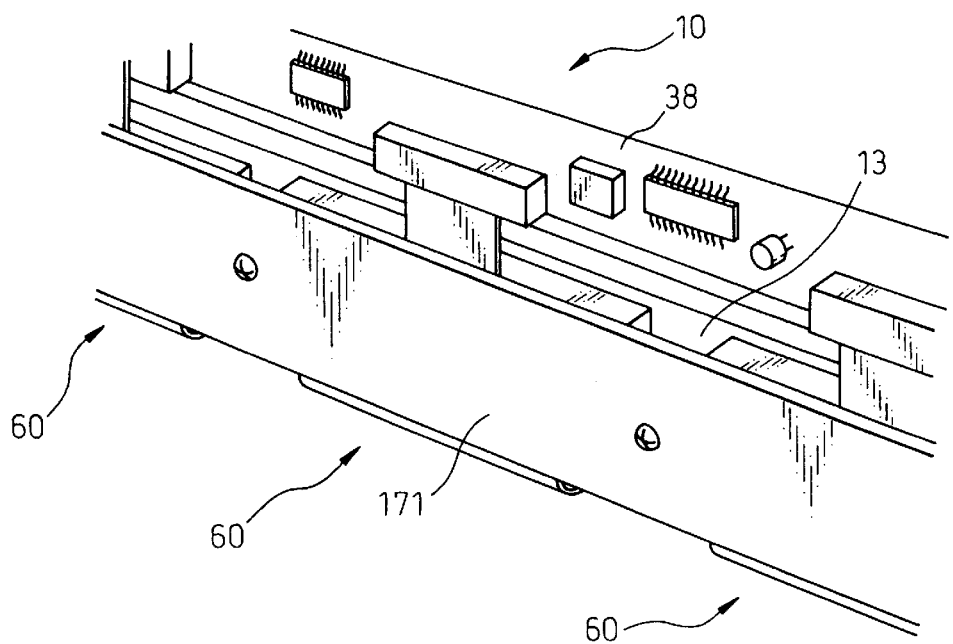
FIG. 38 is a perspective view showing a variation of the plasma display device including the driver IC module.
Figure 39:
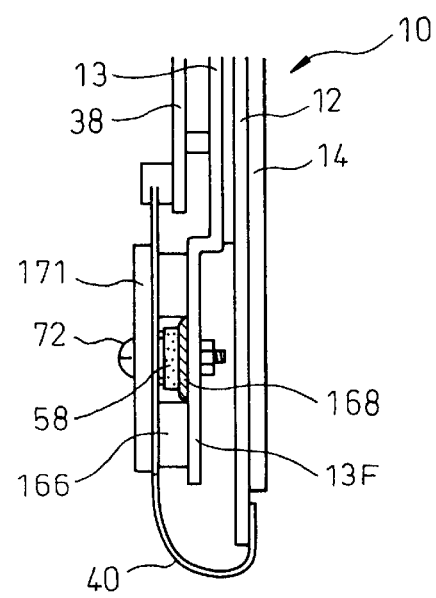
FIG. 39 is a sectional view showing the plasma display device shown in FIG. 38.

FIG. 38 is a perspective view showing a variation of the plasma display device including the driver IC module. FIG. 39 is a sectional view showing the plasma display device shown in FIG. 38. In this embodiment, in the case where a plurality of driver IC modules 60 are incorporated into the display device, the plurality of driver IC modules 60 are simultaneously held by and fixed to the support plate 171 which is common among the plurality of driver IC modules 60. The common support plate 171 is made of a metallic plate such as an aluminum plate and formed into a rectangle. In this case, one common support plate 171 may be provided for the plurality of driver IC modules 60. Alternatively, two common support plates 171 may be provided for the plurality of driver IC modules 60. According to this embodiment, it is unnecessary to provide one support plate for each module 60. Therefore, it is possible to reduce the total cost of manufacturing the entire display device.

Figure 40:
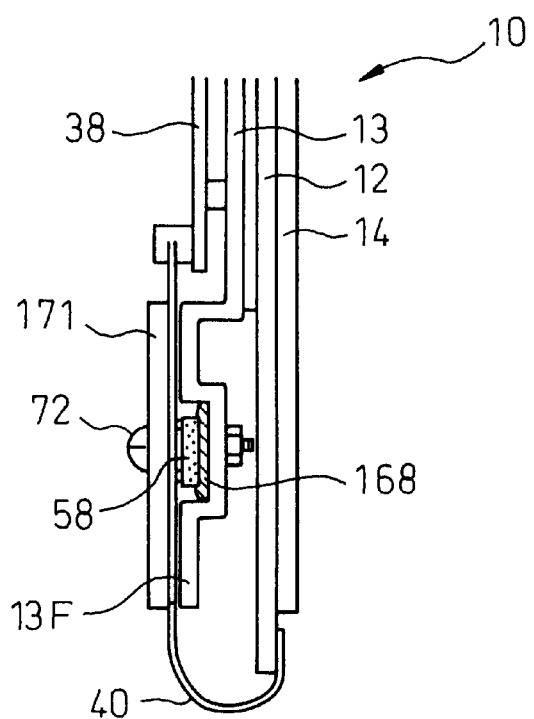
FIG. 40 is a sectional view showing a variation of the plasma display device shown in FIG. 39.
Figure 41:
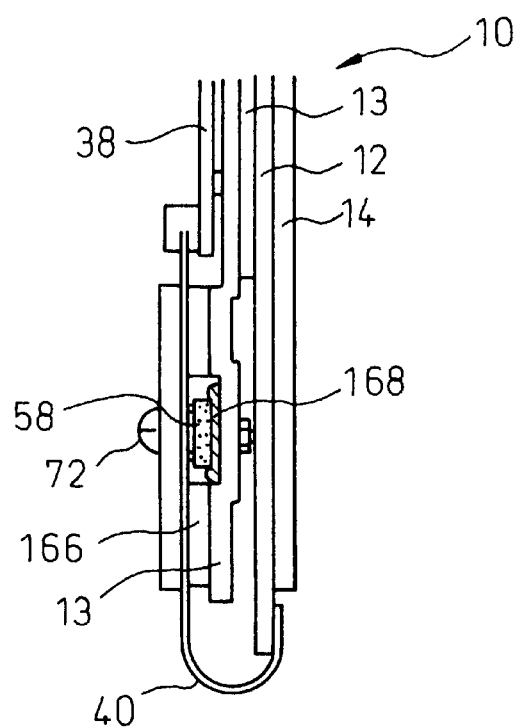
FIG. 41 is a sectional view showing a variation of the plasma display device shown in FIG. 39.

FIG. 40 is a sectional view showing a variation of the plasma display device shown in FIG. 39. FIG. 41 is a sectional view showing a variation of the plasma display device shown in FIG. 39. In FIG. 40, a portion 13F of the chassis 13 functions as a protective member 166. In FIG. 41, a portion 13F of the chassis 13 functions as a heat radiating plate 176 shown in FIG. 22.

The IC chip mounting structure of the present invention is described above in detail referring to the example in which the IC chip mounting structure is applied to the address electrode side of PDP device. However, according to the principle constitution and characteristic of the present application, the IC chip mounting structure of the present application can be also applied to the scanning electrode side. Of course, the same effect can be provided in this case, too.

In the above explanations, the IC chip mounting structure of the present application is applied for driving the electrode of the flat display panel. However, the present application is not limited to the above specific use. It is possible to apply the present invention for mounting the logic IC in the control circuit. Especially when the mounting structure of the present invention, the IC protecting function of which is excellent and the heat radiating performance of which is high, is applied to a recent circuit module in which a large scale and highly integrated IC, the electric power consumption of which is large, is mounted, it becomes possible to realize a highly reliable module of high quality.

Although not particularly shown in the drawing, the IC chip mounting structure of the present invention can be also applied to a case in which electrical parts such as resistors, condensers and so forth except for IC chips are mounted. Of course, the same performance and effect can be provided.

As described above, according to the present invention, especially in the flip-chip type IC chip mounting structure, the IC chip can be positively protected from the circumferential environment. Further, it is possible to obtain a mounting structure, the heat radiating performance of which is excellent with respect to heat generated by the IC chip. Furthermore, it is possible to obtain a highly reliable IC chip mounting structure of high quality, the productivity of which is high and the manufacturing cost of which is low. It is possible to provide a display device to which this mounting structure is applied.

What is claimed is:

1. An IC chip mounting structure comprising:
   at least one IC chip having a first surface having electrodes formed thereon, a second surface opposite to said first surface;
   a wiring board having said IC chip mounted on a first side thereof and conductors connected to the electrodes of said IC chip;
   a protective member attached to said wiring board and having an opening comprising a peripheral wall surrounding said IC chip; and
   a heat conductive first member formed of a resin material arranged in said opening of said protective member to cover and protect said second surface of said IC chip and a circumference thereof.

2. The IC chip mounting structure according to claim 1, further comprising a support member mounted on said wiring board on a second side thereof, opposite to the first side having said IC chip mounted thereon.

3. The IC chip mounting structure according to claim 1, further comprising a heat conductive second member mounted on said wiring board on the first side thereof having said IC chip mounted thereon to cover said heat conductive first member.

4. The IC chip mounting structure according to claim 1, wherein the thickness of said protective member is greater than the height of said IC chip, a part of said heat conductive first member is located in said opening of said protective member, and another part of said heat conductive first member is located outside said opening of said protective member.

5. A display device, comprising:
   a flat display panel comprising a pair of substrates having a plurality of electrodes;
   a circuit board having a circuit for supplying a drive voltage to said electrodes of one of said substrates;
   a chassis mounted on said flat display panel and having said circuit board arranged thereon; and
   a driver IC module mounted on said chassis and connecting the electrodes on said one of the substrates and the circuit of said circuit board to each other;
   wherein said driver IC module comprises:
      at least one driver IC chip having a first surface having electrodes formed thereon and a second surface opposite to said first surface;
      a wiring board having said driver IC chip mounted thereon and conductors connected to the electrodes of said driver IC chip;
      a protective member having an opening comprising a peripheral wall surrounding said driver IC chip; and
      a heat conductive member arranged in said opening of said protective member in contact with said second surface of said driver IC chip.

6. The display device according to claim 5, wherein said wiring board includes a first terminal portion connected to the electrodes of said one of the substrates, a second terminal portion connected to the circuit of said circuit board, and a driver IC chip portion between said first terminal portion and said second terminal portion and having said driver IC chip mounted thereon, said driver IC chip contacts with said chassis thermally through said heat conductive member.

7. An IC chip mounting structure, comprising:

an IC chip;

a wiring board having the IC chip mounted thereon; and at least one protective member arranged on the wiring board adjacent to at least two sides of the IC chip for protecting the IC chip;

wherein said wiring board is made of a flexible wiring board having flexibility and said protective member is made of a material harder than the flexible wiring board.

8. The IC chip mounting structure according to claim 7, further comprising at least one of:

a first member arranged on the back side of the IC chip to cover the IC chip;

a heat conductive second member arranged to cover the first member; and a support member arranged on the side opposite to the side of the wiring board having the IC chip mounted thereon to support the wiring board.

9. The IC chip mounting structure according to claim 7, further comprising:

a first member arranged on the back side of the IC chip to cover the IC chip; and a heat conductive second member arranged to cover the first member, said heat conductive second member also functioning as said protective member.

10. The IC chip mounting structure according to claim 8, wherein at least one of said protective member, said heat conductive second member and said support member is made of a metallic material and has a structure by which a ground terminal of said IC chip is electrically connected to at least one of said protective member, said heat conductive second member and said support member.

11. A display device, comprising:

a flat display panel;

a chassis arranged on the back side of the flat display panel; and a driver IC module having a driver IC chip connected to display electrodes of the flat display panel for driving the flat display panel, and a wiring board having the driver IC chip mounted thereon;

wherein the driver IC module is attached to the chassis, and a protective member or protective structure for at least the driver IC chip is arranged adjacent to at least two sides of the driver IC chip.

12. The IC chip mounting structure according to claim 11, wherein the display device according to claim 12, further comprising at least one of:

a first member arranged on the back side of the IC chip to cover the IC chip;

a heat conductive second member arranged to cover said first member; and a support member arranged on the side opposite to the side of the wiring board having the IC chip mounted thereon.

13. The display device according to claim 11, wherein a plurality of driver IC modules are provided on the chassis and provided with a support member commonly arranged on the back side of the wiring boards of the plurality of driver IC modules.

14. The IC chip mounting structure according to claim 12, wherein at least one of said protective member, said heat conductive second member and said support member is made of a metallic material and has a structure by which a ground terminal of said IC chip is electrically connected to at least said one of said protective member, said heat conductive second member and said support member.

15. The IC chip mounting structure according to claim 11, wherein said flat display panel comprises a plasma display panel.

* * * * *

UNITED STATES PATENT AND TRADEMARK OFFICE
CERTIFICATE OF CORRECTION

PATENT NO.   : 6,703,702 B2
DATED        : March 9, 2004
INVENTOR(S)  : Hirokazu Inoue et al.

It is certified that error appears in the above-identified patent and that said Letters Patent is hereby corrected as shown below:

Column 22,
Line 11, delete "IC chip mounting structure according to claim 11";
Line 12, delete "wherein" and change "12" to -- 11 --.

Signed and Sealed this

Thirteenth Day of July, 2004

JON W. DUDAS
*Acting Director of the United States Patent and Trademark Office*